United States Patent
Nonaka

(10) Patent No.: US 8,281,276 B2
(45) Date of Patent: Oct. 2, 2012

(54) METHOD FOR MANUFACTURING SEMICONDUCTOR INTEGRATED CIRCUIT AND RECORDING MEDIUM

(75) Inventor: Nobuaki Nonaka, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 99 days.

(21) Appl. No.: 12/834,339

(22) Filed: Jul. 12, 2010

(65) Prior Publication Data

US 2011/0029943 A1 Feb. 3, 2011

(30) Foreign Application Priority Data

Jul. 30, 2009 (JP) ................................ 2009-178409

(51) Int. Cl.
*G06F 17/50* (2006.01)

(52) U.S. Cl. ........ 716/134; 716/106; 716/108; 716/113; 716/114; 716/119

(58) Field of Classification Search .................. 716/100, 716/106, 108, 113, 114, 119, 134, 118
See application file for complete search history.

(56) References Cited

U.S. PATENT DOCUMENTS

| | | | | |
|---|---|---|---|---|
| 5,377,197 A | * | 12/1994 | Patel et al. ..................... | 714/724 |
| 6,205,572 B1 | * | 3/2001 | Dupenloup .................... | 716/106 |
| 6,216,254 B1 | * | 4/2001 | Pesce et al. .................... | 716/136 |
| 6,484,294 B1 | * | 11/2002 | Kiyoshige et al. ............ | 716/136 |
| 6,536,024 B1 | * | 3/2003 | Hathaway ..................... | 327/295 |
| 6,609,241 B2 | | 8/2003 | Yonemori | |
| 6,907,585 B2 | * | 6/2005 | Kohno .......................... | 714/738 |
| 2002/0038204 A1 | | 3/2002 | Yonemori | |

FOREIGN PATENT DOCUMENTS

JP 2002-110797 A 4/2002

* cited by examiner

*Primary Examiner* — Sun Lin
(74) *Attorney, Agent, or Firm* — Arent Fox LLP

(57) ABSTRACT

A method for manufacturing a semiconductor integrated circuit includes: generating first data by performing floor planning based on semiconductor integrated circuit information and monitor path circuit information; generating second data by arranging at least one monitor path flip-flop and at least one monitor path circuit element in the first data based on monitor path position information; generating third data by performing arrangement or wiring based on the second data; generating a first timing analysis result by performing timing analysis on data corresponding to the semiconductor integrated circuit information of the third data; generating a second timing analysis result by performing timing analysis on data corresponding to the monitor path circuit information of the third data; modifying the semiconductor integrated circuit information by comparing the first timing analysis result with the second timing analysis result; and manufacturing the semiconductor integrated circuit based on the modified semiconductor integrated circuit information.

18 Claims, 24 Drawing Sheets

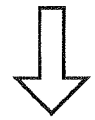

| CLOCK DOMAIN NAME | CLOCK NAME | CLOCK CYCLE [ns] | NUMBER OF FFs |
|---|---|---|---|
| CD1 | ck1 | T1 | k1 |
| CD2 | ck2 | T2 | k2 |
| CD3 | ck3 | T3 | k3 |

CLOCK CYCLE INFORMATION 500

500-1, 500-2, 500-3

DETERMINE LOAD CAPACITANCE C

DETERMINE NUMBER OF STAGES N

CALCULATE WIRING LENGTH l CORRESPONDING TO LOAD CAPACITANCE C

FF ARRANGEMENT POSITION INFORMATION — 900

| FLIP-FLOP ID | INTERSECTION ID |
|---|---|
| FF1 | K1 |
| FF2 | K2 |
| ⋮ | ⋮ |
| FF7 | K7 |
| ⋮ | ⋮ |
| FF13 | K13 |
| ⋮ | ⋮ |
| FF19 | K19 |
| ⋮ | ⋮ |
| FF24 | K24 |
| ⋮ | ⋮ |
| FF49 | K49 |

FIG.13

TIMING ANALYSIS RESULT OF USER CIRCUIT — R1

| INSTANCE NAME | ARRANGEMENT POSITION (X, Y) | SETUP SLACK [ps] | ABNORMAL FLAG |
|---|---|---|---|
| ff1 | ... | +30 | met |
| ff2 | ... | +50 | met |
| ff3 | ... | +25 | met |
| ff4 | (5, 3) | -90 | vio |
| ff5 | (5, 4) | -113 | vio |
| ff6 | (7, 3) | -152 | vio |
| ⋮ | ⋮ | ⋮ | ⋮ |
| ffm | ... | ... | ... |

TIMING ANALYSIS RESULT OF MONITOR PATH — R2

| FLIP-FLOP ID | ARRANGEMENT POSITION (X, Y) | SETUP SLACK [ps] | ABNORMAL FLAG |
|---|---|---|---|
| FF1 | (2, 2) | +30 | met |
| FF2 | (3, 2) | +50 | met |
| FF3 | (4, 2) | +25 | met |
| ⋮ | ⋮ | ⋮ | ⋮ |
| FF27 | (5, 3) | -325 | vio |
| FF28 | (6, 3) | +28 | met |
| FF29 | (7, 3) | -230 | vio |
| ⋮ | ⋮ | ⋮ | ⋮ |
| FF42 | (5, 4) | +33 | met |
| ⋮ | ⋮ | ⋮ | ⋮ |
| FF49 | (5, 5) | +30 | met |

ASSOCIATION RESULT TABLE — 1500

| INSTANCE NAME | FLIP-FLOP ID | ARRANGEMENT POSITION (X, Y) | SETUP SLACK [ps] | ABNORMAL FLAG | |
|---|---|---|---|---|---|
| | | | | USER CIRCUIT | MONITOR PATH |
| ff4 | FF27 | (5, 3) | -90 | vio | vio |
| ff5 | FF42 | (5, 4) | -113 | vio | met |
| ff6 | FF29 | (7, 3) | -152 | vio | vio |

1500-1, 1500-2, 1500-3

METHOD FOR MANUFACTURING SEMICONDUCTOR INTEGRATED CIRCUIT AND RECORDING MEDIUM

CROSS-REFERENCE TO RELATED APPLICATIONS

This application claims the benefit of priority from Japanese Patent Application No. 2009-178409 filed on Jul. 30, 2009, the entire contents of which are incorporated herein by reference.

BACKGROUND

1. Field

Embodiments discussed herein relate to a method for manufacturing a semiconductor integrated circuit.

2. Description of Related Art

In developing a large scale integrated circuit (LSI), logic synthesis of a register transfer level (RTL) description of a target circuit is performed to generate a net list of a gate level. Floor planning, arrangement and wiring, clock tree synthesis, and the like are performed on the net list of the target circuit. Timing analysis of the target circuit is, also, performed.

When a timing violation is detected, optimization, such as buffering (insertion of a buffer) or sizing (gate resizing) is performed. When the timing violation is not overcome by the optimization, the RTL description may be changed.

Related art is disclosed in Japanese Laid-open Patent Publication No. 2002-110797, for example.

SUMMARY

According to one aspects of the embodiments, a method for manufacturing a semiconductor integrated circuit is provided which includes: generating first data by performing floor planning based on semiconductor integrated circuit information and monitor path circuit information; generating second data by arranging at least one monitor path flip-flop and at least one monitor path circuit element in the first data based on monitor path position information; generating third data by performing arrangement or wiring based on the second data; generating a first timing analysis result by performing timing analysis on data corresponding to the semiconductor integrated circuit information of the third data; generating a second timing analysis result by performing timing analysis on data corresponding to the monitor path circuit information of the third data; modifying the semiconductor integrated circuit information by comparing the first timing analysis result with the second timing analysis result; and manufacturing the semiconductor integrated circuit based on the modified semiconductor integrated circuit information.

Additional advantages and novel features of the invention will be set forth in part in the description that follows, and in part will become more apparent to those skilled in the art upon examination of the following or upon learning by practice of the invention.

BRIEF DESCRIPTION OF THE DRAWINGS

FIG. 13 illustrates an exemplary timing analysis;

FIG. 14 illustrates an exemplary timing analysis;

FIG. 15 illustrates an exemplary association result table;

DESCRIPTION OF EMBODIMENTS

Figure 1:
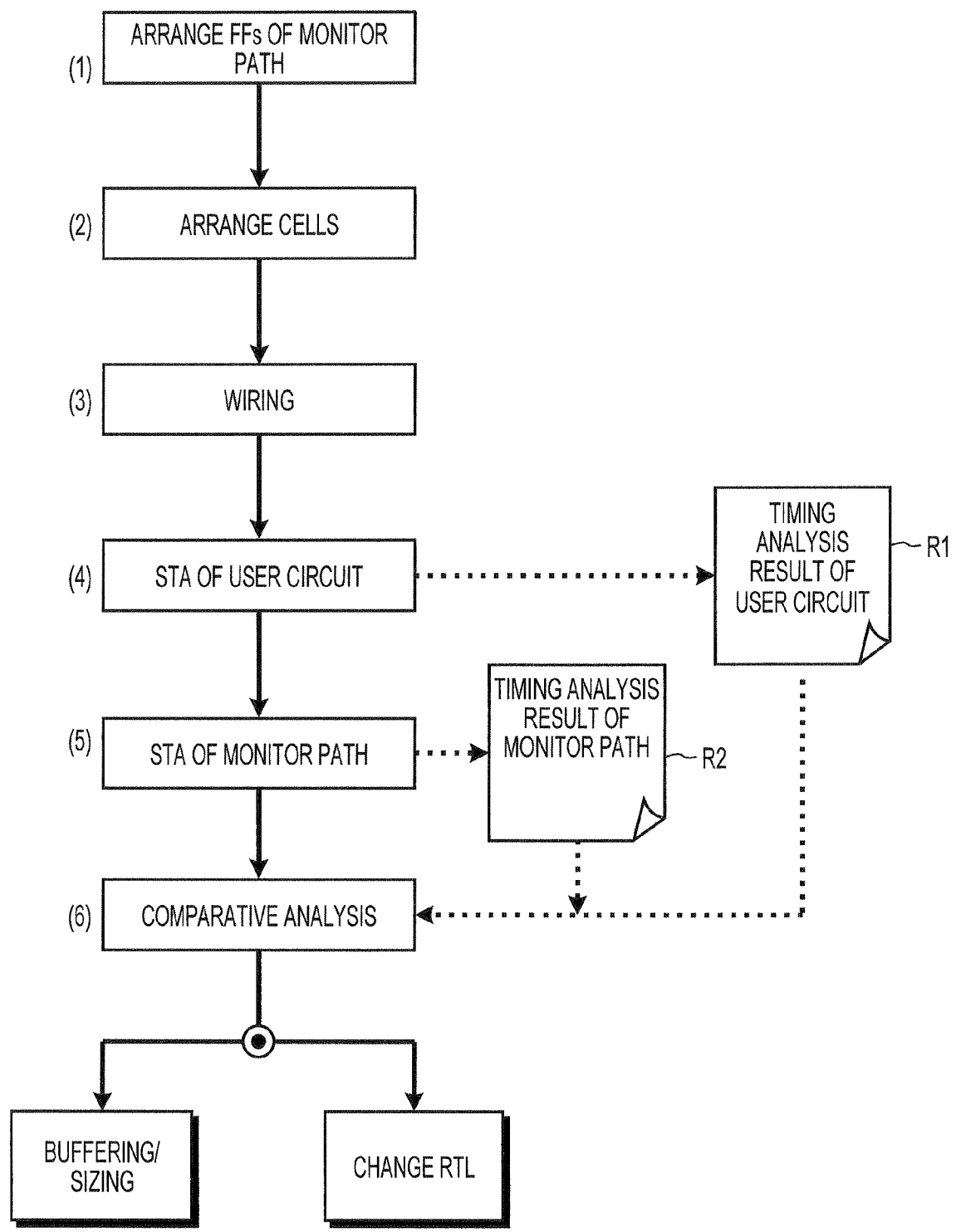
FIG. 1 illustrates an aspect in accordance with an embodiment.

FIG. 1 illustrates an aspect in accordance with an embodiment. In order to specify a cause of a timing error, a monitor path for a test is arranged and wired together with a logic circuit in a layout area of a target circuit. Timing analysis is performed on each of the logic circuit and the monitor path, and a cause of the timing error is specified by analyzing a result of the timing analysis.

A plurality of flip-flops (hereinafter "FFs") included in the monitor path are arranged in the layout area of the target circuit at certain arrangement intervals. The arranged FFs may have an attribute of being unchangeable, such that arrangement positions thereof are not changed in an arrangement/wiring process.

In the layout area of the target circuit, a group of circuit elements included in the target circuit is arranged. In addition, a group of circuit elements included in the monitor path except already-arranged FFs is arranged. The circuit elements include cells, such as an FF, inverter, buffer, AND gate, and OR gate.

Wiring between the circuit elements arranged in the layout area is performed based on a connection relationship between the circuit elements, so that the logic circuit (hereinafter referred to as "user circuit") and monitor path of the target circuit are generated.

Timing analysis and static timing analysis (STA) are performed on the user circuit generated in the layout area of the target circuit, and a timing analysis result R1 of the user circuit is output.

Timing analysis is performed on the monitor path generated in the layout area of the target circuit, and a timing analysis result R2 of the monitor path is output.

The timing analysis result R1 of the user circuit is compared with the timing analysis result R2 of the monitor path, so that a cause of a timing error that occurs in the target circuit is specified.

It is determined whether optimization using buffering or sizing should be performed in the target circuit, or whether RTL description of the target circuit should be changed.

Figure 2A:
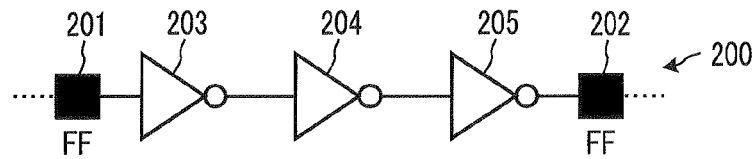
FIGS. 2A and 2B illustrate an exemplary monitor path.
Figure 2B:
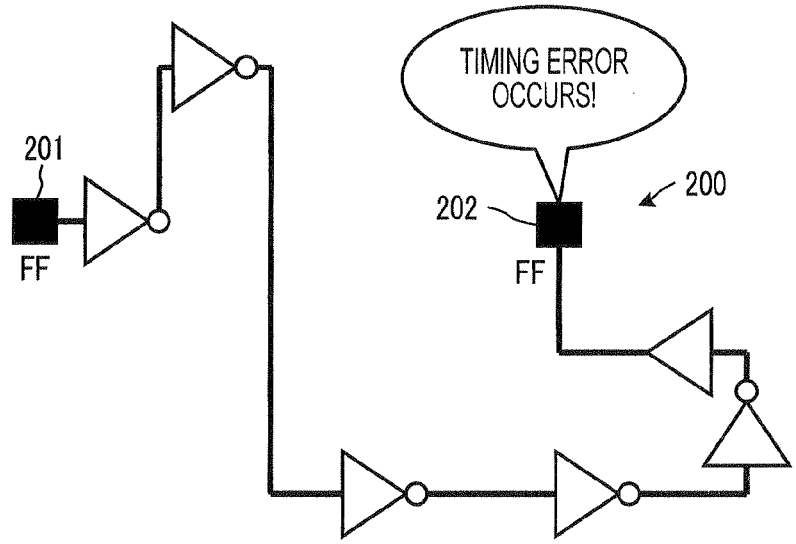

FIGS. 2A and 2B illustrate an exemplary monitor path. A monitor path 200 includes FFs 201 and 202 and inverters 203 to 205.

The FFs 201 and 202 in the monitor path 200 may have an attribute of being unchangeable in which the arrangement positions thereof are not changed. The arrangement positions of the FFs 201 and 202 may not be changed in an arrangement/wiring process.

The inverters 203 to 205 in the monitor path 200 are arranged and wired together with a group of circuit elements in a user circuit in an arrangement/wiring process. The monitor path 200 may logically be the circuit illustrated in FIG. 2A. In an area where arrangement density or wiring density is high, rerouting of wiring or insertion of a buffer is performed as illustrated in FIG. 2B. For example, two inverters and one buffer may be inserted into the monitor path 200.

A timing error in the FF 202 in the latter stage may occur when rerouting of wiring or insertion of a buffer is performed in the monitor path 200. When neither rerouting of wiring nor insertion of a buffer is performed, a signal may reliably propagate between the FFs 201 and 202.

The wiring property and the difficulty of timing optimization in the layout area are determined based on the characteristics of the monitor path 200. For example, if a timing error occurs in the FF 202 in the monitor path 200, it may be determined that the arrangement density or wiring density in the vicinity of the FF 202 has a problem. If no timing error occurs in the FF 202, it may be determined that the arrangement density or wiring density in the vicinity of the FF 202 has no problem.

The arrangement interval between the FFs 201 and 202 may have some margin (allowance) so that no timing error occurs even if rerouting of wiring or insertion of a buffer is performed. The size of margin may be arbitrarily set by adjusting the arrangement interval between the FFs 201 and 202.

Figure 3:
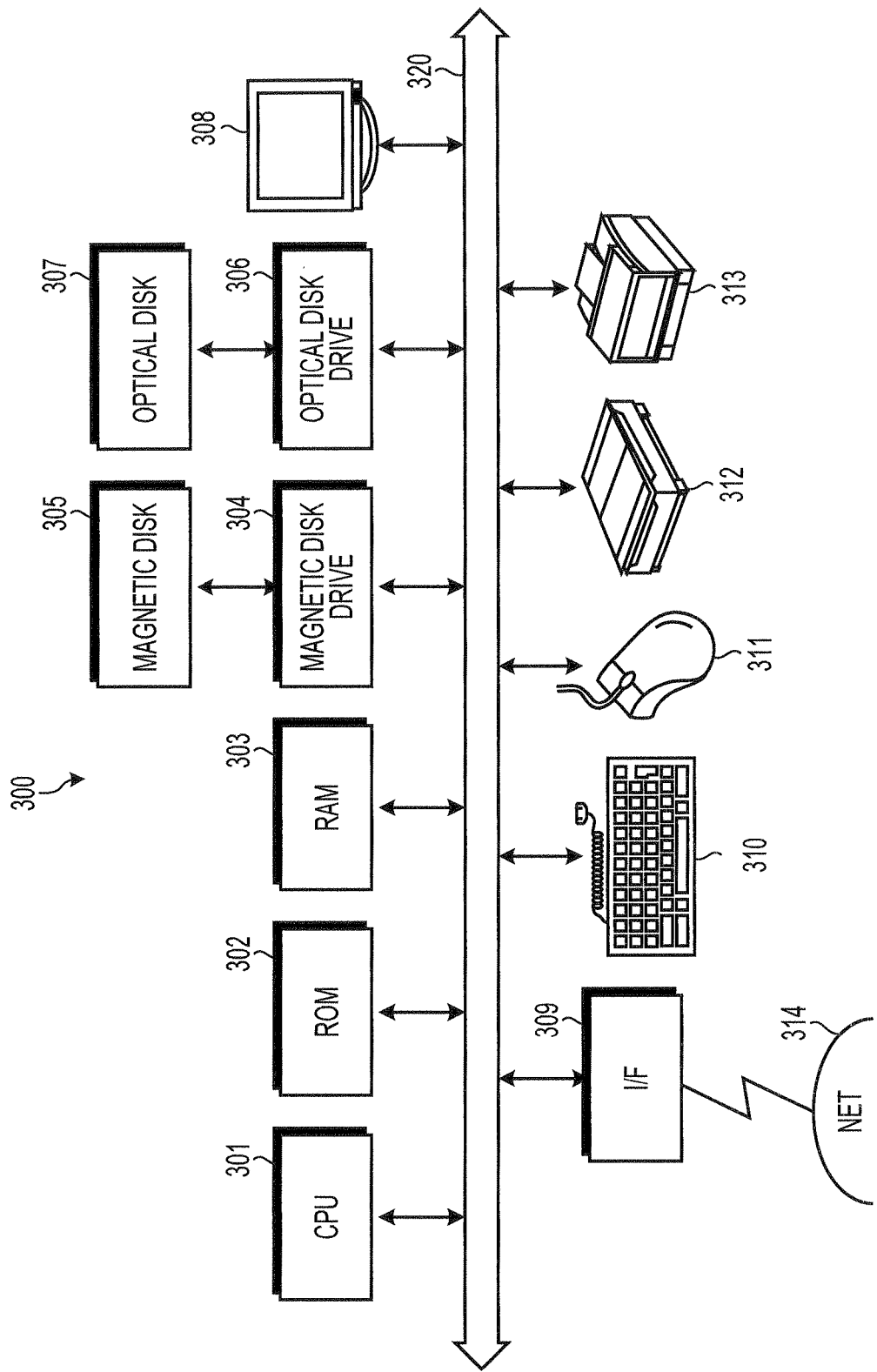
FIG. 3 illustrates an exemplary design support apparatus.

FIG. 3 illustrates an exemplary design support apparatus. A design support apparatus 300 includes a central processing unit (CPU) 301, a read only memory (ROM) 302, a random access memory (RAM) 303, a magnetic disk drive 304, a magnetic disk 305, an optical disk drive 306, an optical disk 307, a display 308, an interface (I/F) 309, a keyboard 310, a mouse 311, a scanner 312, and a printer 313. The individual elements are mutually coupled via a bus 320.

The CPU 301 controls the design support apparatus 300 entirely. The ROM 302 stores a program, such as a boot program. The RAM 303 is used as a work area of the CPU 301. The magnetic disk drive 304 controls read of data from/write of data on the magnetic disk 305 in accordance with control by the CPU 301. The magnetic disk 305 stores data that is written thereon under control by the magnetic disk drive 304.

The optical disk drive 306 controls read of data from/write of data on the optical disk 307 in accordance with control by the CPU 301. The optical disk 307 stores data that is written under control by the optical disk drive 306 and causes a computer to read the data stored in the optical disk 307.

The display 308 displays a cursor, icon, and tool box, and also displays data such as a document, image, and function information. The display 308 may include a cathode ray tube (CRT), a thin film transistor (TFT) liquid crystal display, a plasma display, or the like.

The I/F 309 is coupled to a network 314, such as a local area network (LAN), a wide area network (WAN), or the Internet, via a communication line, and is coupled to another apparatus via the network 314. The I/F 309 serves as an interface between the network 314 and the inside of the apparatus, and controls input of data from/output of data to an external apparatus. The I/F 309 includes a modem, a LAN adaptor, or the like.

The keyboard 310 includes keys for inputting characters, numerals, various instructions, and the like. Also, the keyboard 310 may include a touch-panel-type input pad, numeric keys, or the like. The mouse 311 may be used to move a cursor or window, select a range, or change the size of a window. The mouse 311 may include a pointing device, a track ball, a joy stick, or the like.

The scanner 312 optically reads an image so that image data is captured into the design support apparatus 300. The scanner 312 may include an optical character reader (OCR). The printer 313 prints image data or document data. The printer 313 may include a laser printer or an inkjet printer.

Figure 4:
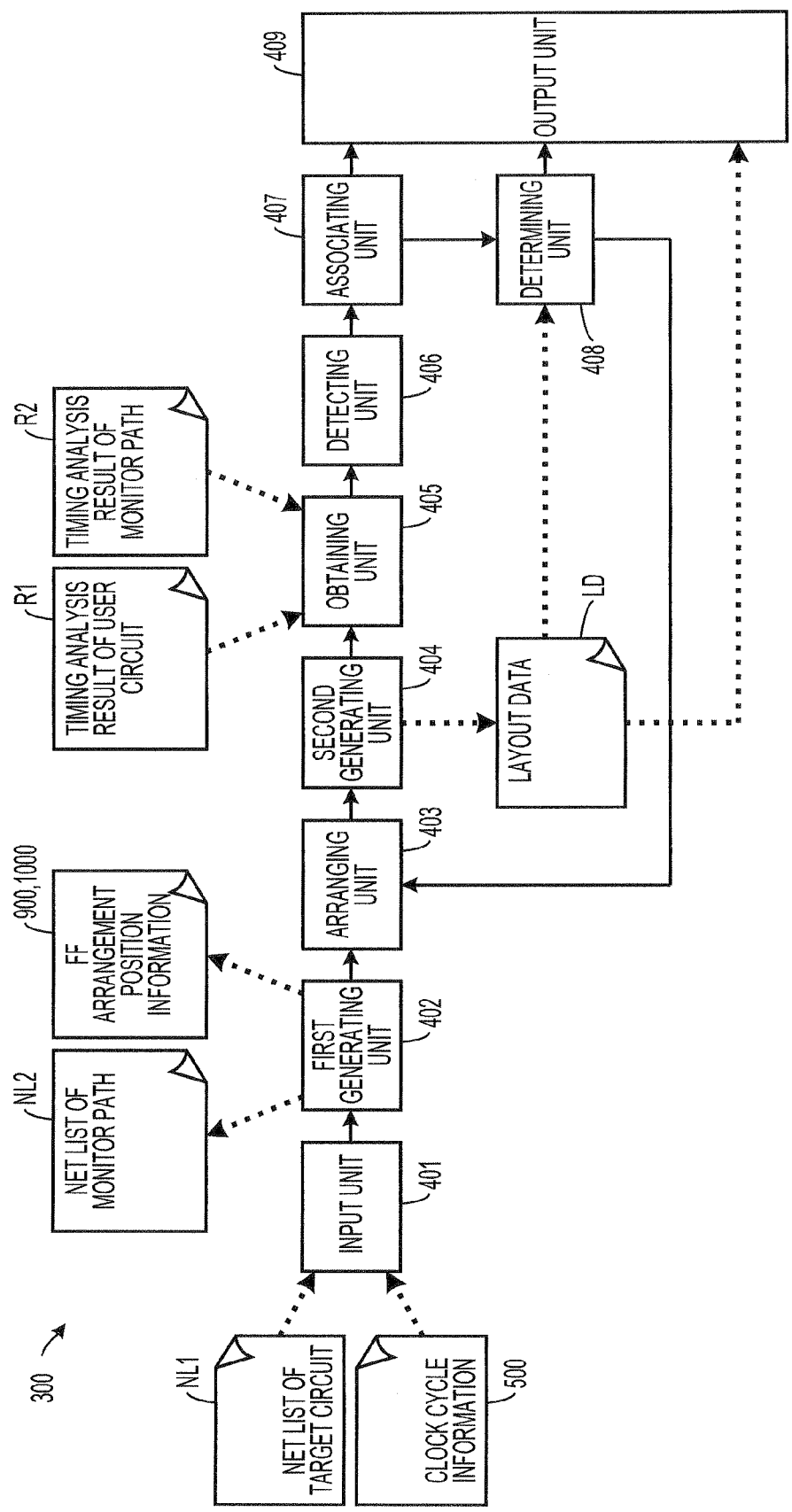
FIG. 4 illustrates an exemplary design support apparatus.

FIG. 4 illustrates an exemplary design support apparatus. The design support apparatus 300 includes an input unit 401, a first generating unit 402, an arranging unit 403, a second generating unit 404, an obtaining unit 405, a detecting unit 406, an associating unit 407, a determining unit 408, and an output unit 409. For example, a program stored in a storage device, such as the ROM 302, RAM 303, magnetic disk 305, or optical disk 307 illustrated in FIG. 3, may be executed by the CPU 301.

The input unit 401 receives input of circuit information about a target circuit. The circuit information may include a net list NL1 of the target circuit and clock cycle information 500 illustrated in FIG. 5. The net list NL1 includes information about a connection relationship between circuit elements included in the target circuit, for example, between cells. The clock cycle information 500 includes information about the cycle of clock that drives FFs in the target circuit.

The circuit information may be input to the input unit 401 via the keyboard 310 or mouse 311 illustrated in FIG. 3. Alternatively, the circuit information may be input from a database or library. The circuit information is stored in a storage area, such as the RAM 303, magnetic disk 305, or optical disk 307.

Figure 5:
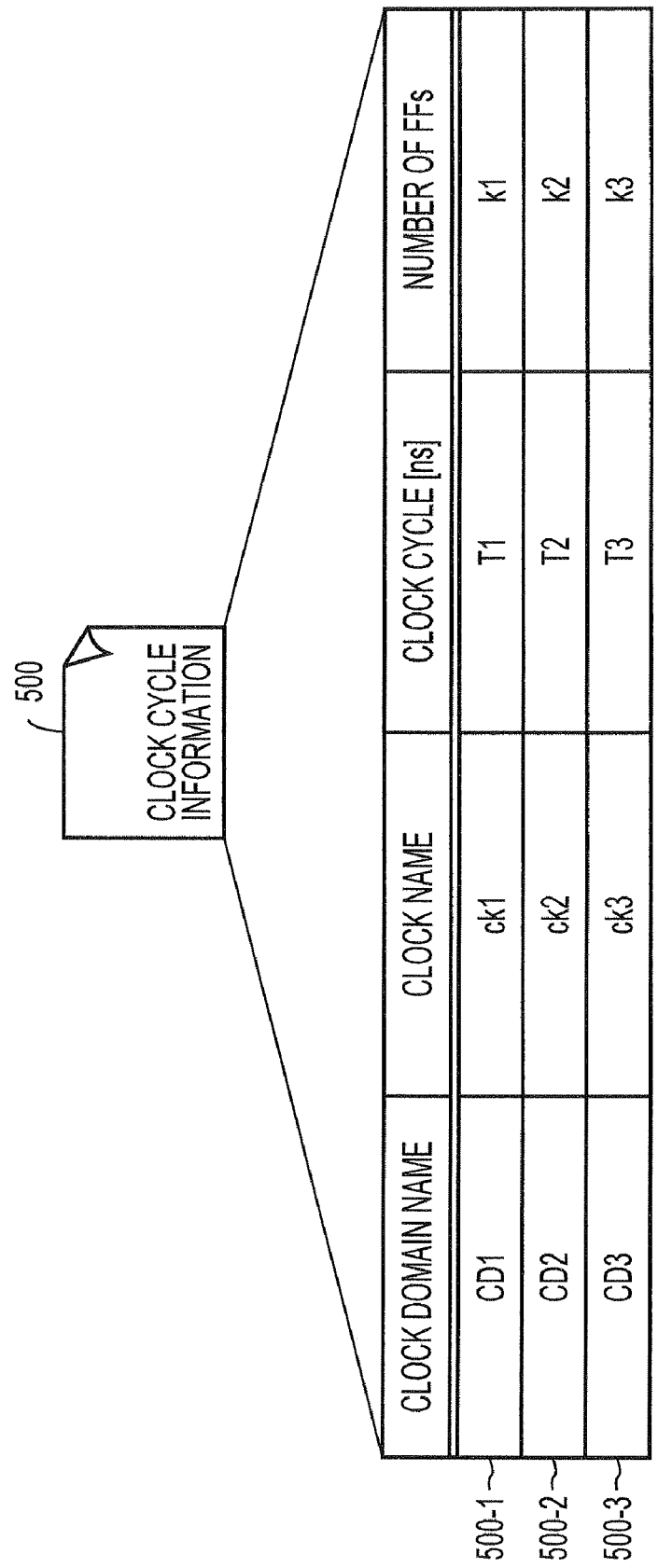
FIG. 5 illustrates exemplary clock cycle information.

FIG. 5 illustrates exemplary clock cycle information. The clock cycle information 500 includes field of clock domain name, clock name, clock cycle, and the number of FFs. Information is set in each of the fields, so that clock cycle information segments 500-1 to 500-3 are stored as records.

The clock domain name indicates the name of a clock domain in the target circuit. The clock domain indicates a synchronization portion that operates with substantially the same clock in the target circuit. The clock name indicates the name of the clock. The clock cycle is the cycle of each clock. The number of FFs may be the number of FFs driven by each clock.

In the clock cycle information segment 500-1, the clock cycle of a clock ck1 in a clock domain CD1 is T1, and the number of FFs driven by the clock ck1 is k1. When the relationship among the numbers of FFs driven by the respective clocks ck1 to ck3 is k1>k2>k3, for example, the clock ck1 that drives the largest number of FFs may be set as a main clock.

The first generating unit 402 generates a monitor path to be inserted into the target circuit based on the circuit information of the target circuit, the monitor path being inserted into the target circuit in order to specify a cause of a timing error in the target circuit. For example, the first generating unit 402 generates FF arrangement position information and a net list NL2 related to the monitor path based on the input circuit information.

The FF arrangement position information indicates the arrangement positions of FFs included in the monitor path in the layout area of the target circuit. The net list NL2 indicates the connection relationship between the circuit elements included in the monitor path. The net list NL2 may be stored in a storage area, such as the RAM 303, magnetic disk 305, or optical disk 307.

The first generating unit 402 performs floor planning based on semiconductor integrated circuit information and monitor path circuit information so as to generate first data. The semiconductor integrated circuit information may include the net list NL1 of the target circuit and the clock cycle information 500, for example. The monitor path circuit information may include the net list NL2 of the monitor path and the FF arrangement position information.

The arranging unit 403 arranges FFs for the monitor path (hereinafter referred to as "monitor path FFs") and circuit elements for the monitor path (hereinafter referred to as "monitor path circuit elements") in the first data based on monitor path position information, thereby generating second data. The monitor path position information may include the FF arrangement position information, for example. The arranging unit 403 arranges a plurality of FFs included in the monitor path, for example, monitor path FFs, at certain arrangement intervals in the layout area of the target circuit. For example, the arranging unit 403 arranges the plurality of FFs included in the monitor path in the layout area after floor planning and wiring of a power supply in accordance with the FF arrangement position information.

An attribute of being unchangeable is set in the FFs in the monitor path arranged in the layout area so that the arrangement positions thereof are not changed in an arrangement/wiring process. In floor planning, an I/O cell and a macro cell such as a memory are arranged in the layout area. An arrangement result may be stored in a storage area, such as the RAM 303, magnetic disk 305, or optical disk 307.

The arranging unit 403 arranges a group of circuit elements included in the monitor path except already-arranged FFs, for example, monitor path circuit elements, in the layout area of the target circuit. For example, the arranging unit 403 arranges the remaining circuit elements included in the monitor path in the layout area based on the net list NL2 of the monitor path and the arrangement result of the FFs. The arrangement result of the FFs may include floor plan information. Alternatively, the circuit elements in the monitor path except the FFs may be arranged using an existing arrangement/wiring tool.

The arranging unit 403 may divide an area where circuit elements may be arranged (hereinafter referred to as "circuit element arrangement area") into certain quadrangles based on the semiconductor integrated circuit information, arrange the monitor path FFs at intersections of the quadrangles, and arrange the monitor path circuit elements between the monitor path FFs. The semiconductor integrated circuit information may include information about the layout area after floor planning and wiring of the power supply.

The arranging unit 403 arranges the group of circuit elements included in the target circuit in the layout area. For example, the arranging unit 403 arranges the group of circuit elements included in the target circuit in the layout area based on the net list NL1 of the target circuit and the floor plan information. Alternatively, the group of circuit elements in the target circuit may be arranged using an existing arrangement/wiring tool. Either of an arrangement process of arranging the group of circuit elements in the target circuit and an arrangement process of arranging the group of circuit elements in the monitor path may be performed first.

The second generating unit 404 generates third data based on the second data. The second generating unit 404 performs wiring between the circuit elements based on an arrangement result, thereby generating the user circuit and monitor path. Accordingly, layout data LD of the target circuit in which the monitor path is inserted is generated. The wiring between the circuit elements in the layout area may be performed using an existing arrangement/wiring tool, for example. The layout data LD may be stored in a storage area, such as the RAM 303, magnetic disk 305, or optical disk 307.

The obtaining unit 405 performs timing analysis on the data corresponding to the semiconductor integrated circuit information of the third data, thereby generating a first timing analysis result. The obtaining unit 405 performs timing analysis on the user circuit based on a generation result, thereby obtaining a timing analysis result R1 of the user circuit. For example, the obtaining unit 405 performs static timing analysis (STA) on the user circuit in the target circuit based on the layout data LD, thereby obtaining the timing analysis result R1 of the user circuit.

The obtaining unit 405 performs timing analysis on the data corresponding to the monitor path circuit information of the third data, thereby generating a second timing analysis result. The obtaining unit 405 performs timing analysis on the monitor path based on a generation result, thereby obtaining a timing analysis result R2 of the monitor path. For example, the obtaining unit 405 performs STA on the monitor path in the target circuit based on the layout data LD, thereby obtaining the timing analysis result R2 of the monitor path.

The design support apparatus 300 may perform timing analysis on the user circuit and the monitor path. An external simulator that is capable of performing communication via the network 314 may perform timing analysis. An analysis result may be stored in a storage area, such as the RAM 303, magnetic disk 305, or optical disk 307.

The detecting unit 406 detects one FF in the user circuit. For example, the detecting unit 406 detects arrangement position information of one FF from the group of circuit elements in the user circuit based on an instance name in the layout data LD. The instance name indicates a circuit element in the target circuit. A detection result may be stored in a storage area, such as the RAM 303, magnetic disk 305, or optical disk 307.

The detecting unit 406 may detect an FF in which a timing error occurs in the user circuit. For example, the detecting unit 406 detects an FF in which a timing error occurs based on the timing analysis result R1 of the user circuit. The detecting unit 406 detects the arrangement position information of the FF in which a timing error occurs based on the layout data LD.

The detecting unit 406 detects another FF in the monitor path near the detected FF. For example, the detecting unit 406 detects the arrangement position information of another FF in the monitor path near the detected FF based on a flip-flop ID in the layout data LD. The flip-flop ID indicates an FF in the monitor path.

The associating unit 407 associates the timing analysis result of the FF in the user circuit with the timing analysis result of the other FF in the monitor path near the FF. For example, the associating unit 407 associates the timing analysis result of the FF in the user circuit with the timing analysis result of the other FF in the monitor path based on the detection result and the timing analysis results R1 and R2. An association result may be stored in an association result table 1500 illustrated in FIG. 15, for example.

The output unit 409 outputs the association result. The association result may be displayed on the display 308, printed by the printer 313, or transmitted to an external apparatus via the I/F 309. The association result may be stored in a storage area, such as the RAM 303, magnetic disk 305, or optical disk 307.

The determining unit 408 determines the arrangement positions of the FFs as a dense area based on timing error information in the association result. The dense area may be an area where arrangement density or wiring density is high in the layout area of the target circuit.

Figure 17:
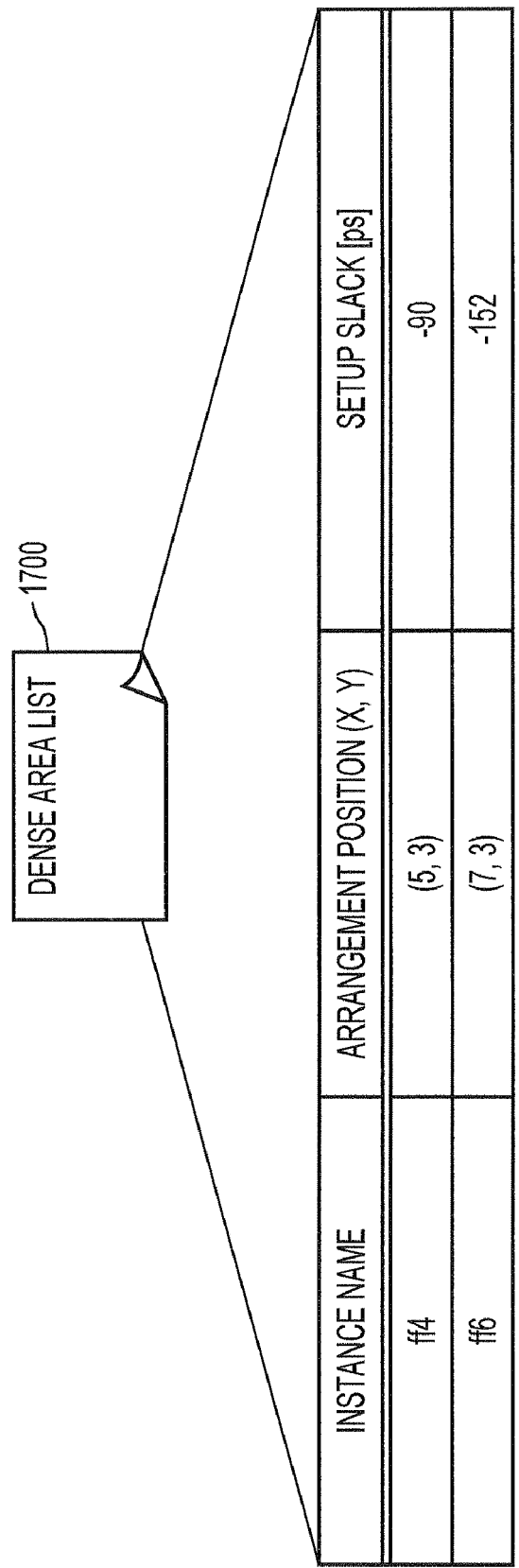
FIG. 17 illustrates an exemplary dense area list.

The arrangement positions of the FFs determined to be a dense area, for example, arrangement position information, may be stored in a dense area list 1700 illustrated in FIG. 17. The arrangement position information may include, as an arrangement position indicating a dense area, the arrangement position of a circuit element near an FF, for example, a circuit element before or/and after an FF.

The output unit 409 outputs the arrangement positions of the FFs determined as a dense area. For example, the output unit 409 may output the dense area list 1700 illustrated in FIG. 17.

The arranging unit 403 arranges the group of circuit elements in the user circuit in the layout area based on a determination result. For example, the arranging unit 403 may rearrange the group of circuit elements in the user circuit in the layout area using an existing arrangement/wiring tool so that the arrangement density or wiring density in the vicinity of an FF is improved.

The second generating unit 404 wires the group of circuit elements in the monitor path arranged in the layout area so as to generate the monitor path, and also wires the group of circuit elements rearranged in the layout area so as to generate a new logic circuit. Layout data LD is generated in which the arrangement/wiring density in the vicinity of an FF in the target circuit is improved. The arranging unit 403 and the second generating unit 404 may modify the first data or second data.

The output unit 409 may output a generation result. For example, the output unit 409 may output the improved layout data LD.

When an association result indicates a timing error of an FF, the determining unit 408 determines to change a path including the FF having the timing error among paths in the user circuit. The path including the FF having the timing error may be specified by searching a route from an FF to another FF via a circuit element in the previous stage. The path to be changed may be stored in a change target list 1800 illustrated in FIG. 18, for example.

The output unit 409 outputs the path to be changed. For example, the output unit 409 may output the change target list 1800 illustrated in FIG. 18.

Figure 6:
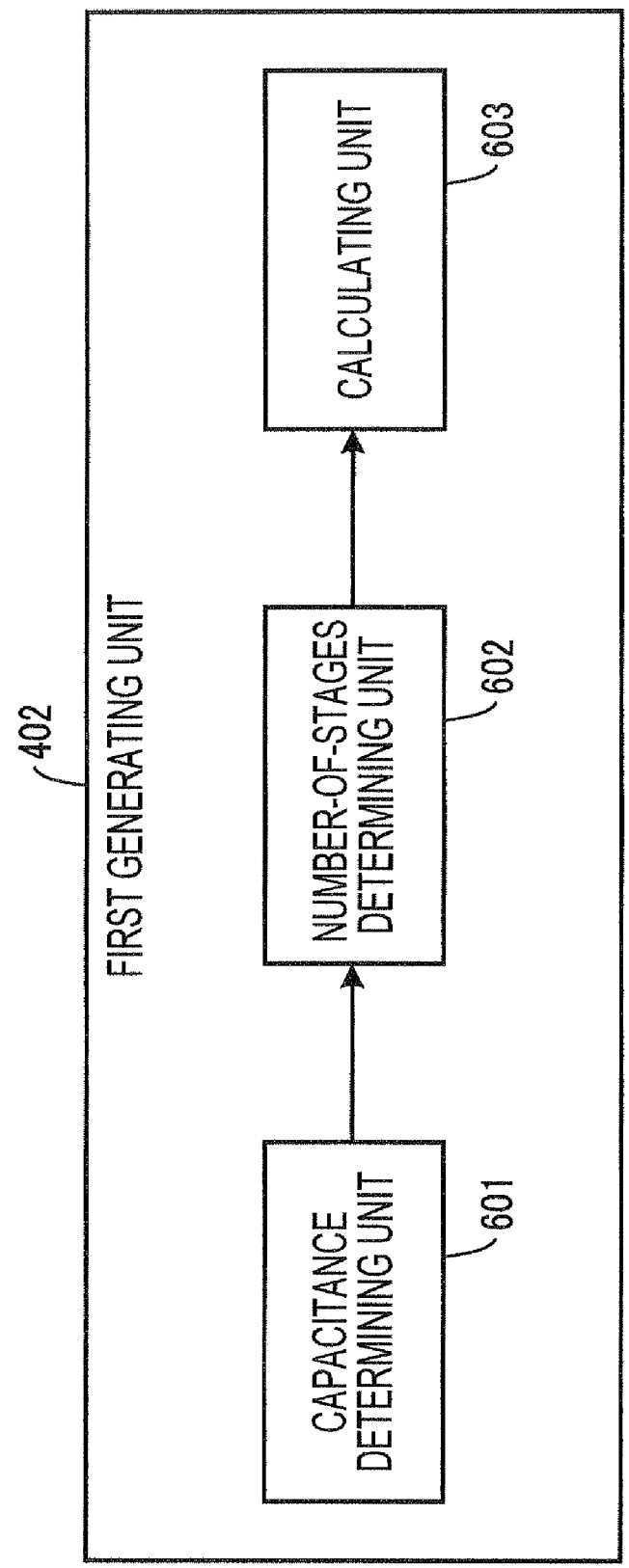
FIG. 6 illustrates an exemplary first generating unit.

FIG. 6 illustrates an exemplary first generating unit. The first generating unit illustrated in FIG. 6 may be the first generating unit 402 illustrated in FIG. 4. FIGS. 7A to 7F illustrate an exemplary generation of a monitor path. The first generating unit 402 illustrated in FIG. 6 includes a capacitance determining unit 601, a number-of-stages determining unit 602, and a calculating unit 603.

The first generating unit 402 generates monitor path circuit information, for example, FF arrangement position information. The monitor path circuit information includes monitor path segments, each segment including cascaded monitor path circuit elements having a certain capacitance, the number of the monitor path circuit elements being N. N may be an integer of two or more. Each monitor path FF is arranged between monitor path segments. A circuit element that outputs a signal having a certain slew may be selected as a monitor path circuit element. A ring oscillator that includes an odd number of (e.g., N) monitor path circuit elements may oscillate.

The capacitance determining unit 601 determines circuit elements and a load capacitance C corresponding to a maximum length of wiring capable of driving the circuit elements. For example, a logic gate or the like drives a wire and supplies current to the wire in order to hold a logic value, so that the voltage of the wire, for example, the logic value, is maintained.

The load capacitance includes, for example, an output pin capacitance of a logic gate, an input pin capacitance of a logic gate which is coupled to the logic gate, and a capacitance of a wire coupling the logic gates. A monitor path circuit element may include an inverter and a wire having a certain capacitance, the wire being coupled to the inverter. For example, the capacitance determining unit 601 inputs a standard slew to an inverter 711 having a standard drive ability and determines the maximum capacitance of a capacitor 712 capable of outputting the standard slew to be the load capacitance C.

"Slew" means a transition time when a target voltage V, for example, a voltage applied to a circuit element with respect to a maximum amplitude of a signal, changes from a % to b %, for example, from 10% to 90%. The target voltage V may be 1.2 V, for example. The slew may be a transition time when the voltage changes from 0.2 V to 1.0 V, for example. The standard slew may be 1.2 ns, for example.

The capacitance determining unit 601 inputs a rising waveform of a standard slew of 1.2 ns to the inverter 711 and measures an output slew. A measurement result may be stored in a measurement result table 800 illustrated in FIG. 8, for example.

For example, the capacitance determining unit 601 measures an output slew a plurality of times by changing a parameter "s" included in the following expression (1) to 1, 2, .... "C" represents the load capacitance [pf] of the capacitor 712, and "a" represents a load capacitance [pf]. "α" may be an arbitrary constant. "s" represents a parameter.

$$C = \alpha \times s \qquad (1)$$

Figure 8:
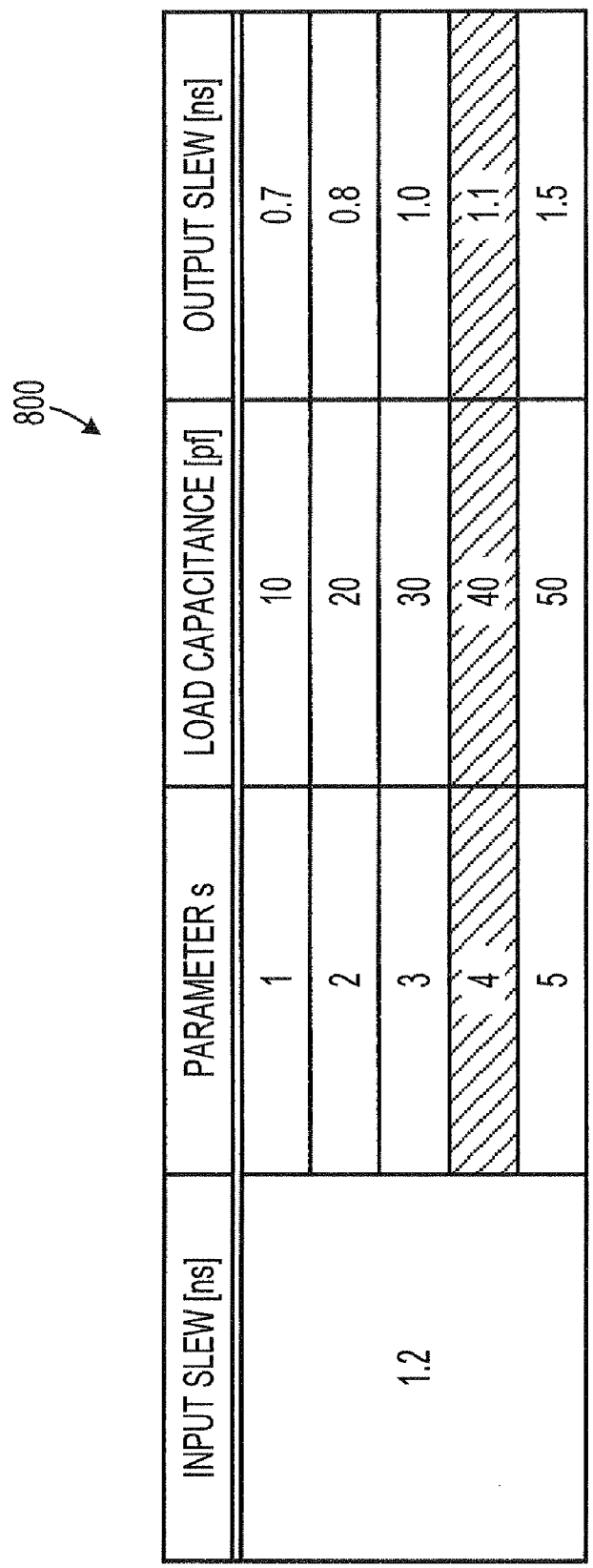
FIG. 8 illustrates an exemplary measurement result table.

FIG. 8 illustrates an exemplary measurement result table. The measurement result table 800 includes field of input slew, parameter "s", load capacitance, and output slew. Information is set in each of the field, so that a measurement result is stored as a record. The value of the constant "α" in expression (1) may be 10 pf.

With reference to the measurement result table 800, the capacitance determining unit 601 determines a load capacitance of 40 pf, in which the parameter "s" is the maximum with an output slew of 1.2 ns or less, as the load capacitance C. The load capacitance C may correspond to the maximum capacitance of the wire driven by the inverter 711. The determined load capacitance C may be stored in a storage area, such as the RAM 303, magnetic disk 305, or optical disk 307.

The number-of-stages determining unit 602 illustrated in FIG. 6 determines the maximum number N of pairs 710 included in a ring oscillator. The capacitor 712 has the load capacitance C determined by the capacitance determining unit 601. For example, the number-of-stages determining unit 602 generates a ring oscillator 720 by coupling N stages of pairs 710. N may be an odd number (N=2n+1, in which n=0, 1, 2, ...).

The number-of-stages determining unit 602 determines the maximum number of stages N with which the ring oscillator 720 is capable of oscillating at a clock cycle T of the target circuit, while increasing the number of stages N of the ring oscillator 720 from 1, 3, .... The clock cycle T may be arbitrarily selected from the clock cycle information 500 illustrated in FIG. 5. The clock cycle T may be a main clock selected from the clock cycle information 500, for example, clock cycle T1 of clock ck1.

Whether the ring oscillator 720 is capable of oscillating or not may be determined by simulation of a transistor level. The simulation may be performed by an external simulator. The determined number of stages N may be stored in a storage area, such as the RAM 303, magnetic disk 305, or optical disk 307.

The calculating unit 603 illustrated in FIG. 6 calculates a wiring length l corresponding to the load capacitance C. For example, the calculating unit 603 calculates the wiring length l corresponding to the load capacitance C by using the following expression (2).

$$l = C/C\text{wire} \qquad (2)$$

"Cwire" represents a capacitance [pf] per unit length of a given wiring layer, for example, three-layer wiring or four-layer wiring.

The calculating unit 603 calculates an arrangement interval L at which a signal may be transmitted between FFs in the time period of a clock cycle T. For example, the calculating unit 603 calculates the arrangement interval L between FFs by using the following expression (3). The arrangement interval L may correspond to the maximum distance at which a signal may be transmitted between FFs in the time period of the clock cycle T. "L" represents the arrangement interval between FFs. "l" represents a wiring length corresponding to the load capacitance C. "N" represents the maximum number of stages of pairs 710 with which the ring oscillator 720 is capable of oscillating.

$$L = l \times N \qquad (3)$$

The first generating unit 402 generates arrangement position information of the FFs included in the monitor path based on the arrangement interval L between FFs. For example, the first generating unit 402 divides the layout area of the target circuit, for example, a core area, into a grid pattern with the arrangement interval L being a grid width. The first generating unit 402 generates arrangement position information indicating that intersections of border lines of individual areas in the grid pattern serve as arrangement positions of FFs.

When an arrangement prohibition area is set in the layout area of the target circuit, the intersections of the border lines that overlap the arrangement prohibition area are excluded from the target of the arrangement positions of FFs. The core area may be an area where standard cells may be arranged in the layout area except an I/O area.

The calculating unit 603 calculates the number of intersections X of the border lines of the individual areas. The intersections that overlap the arrangement prohibition area in the layout area are excluded from the target of calculation. As illustrated in part (A) of FIG. 7E, when there is no arrangement prohibition area, the number of intersections X of the individual areas may be 49. As illustrated in part (B) of FIG. 7E, when there is an arrangement prohibition area, the number of intersections X of the individual areas may be 43. The calculated number of intersections X may be stored in a storage area, such as the RAM 303, magnetic disk 305, or optical disk 307.

The ring oscillator 720 in which N stages of pairs 710, each including an inverter 711 and a capacitor 712, are cascaded is formed. Alternatively, a ring oscillator in which N−1 stages of pairs each including a buffer and a capacitor, and one stage of the pair 710 including an inverter 711 and a capacitor 712, are cascaded may be formed. The capacitance of a capacitor that forms a pair with a buffer may be a load capacitance corresponding to the maximum length of wiring that may be driven by the buffer. In the ring oscillator, a plurality of circuit elements may be coupled in a ring shape so that logical NOT of input is realized.

The first generating unit 402 generates a net list NL2 including FFs at the intersections, the number of which is X, and a monitor path including N stages of inverters 711 between the respective FFs. The generated net list NL2 may be stored in a storage area, such as the RAM 303, magnetic disk 305, or optical disk 307.

Figure 9:
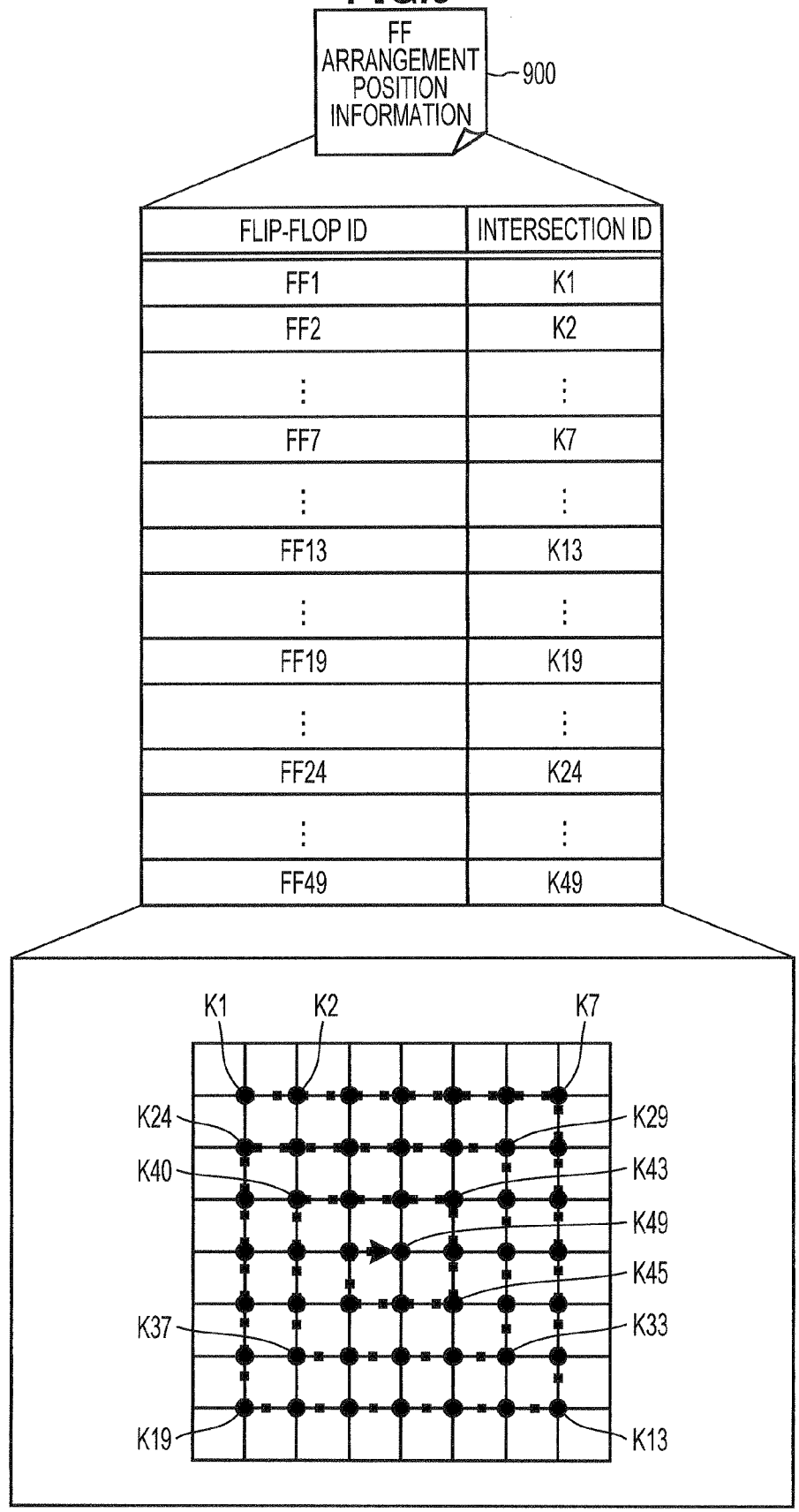
FIG. 9 illustrates exemplary FF arrangement position information.

FIG. 9 illustrates exemplary FF arrangement position information.

The FF arrangement position information 900 illustrated in FIG. 9 includes field of flip-flop ID and intersection ID. Information is set in each of the fields, so that the arrangement positions of the respective FFs included in the monitor path are stored as records. The flip-flop ID includes an identifier that identifies an FF included in the monitor path.

The intersection ID may be an identifier that identifies an intersection of border lines of individual areas in the layout area of the target circuit. For example, intersection IDs may be given to the respective intersections in the layout area in ascending order in a clockwise spiral direction. Each intersection ID may include position information for specifying a position in the layout area of the target circuit.

Figure 10:
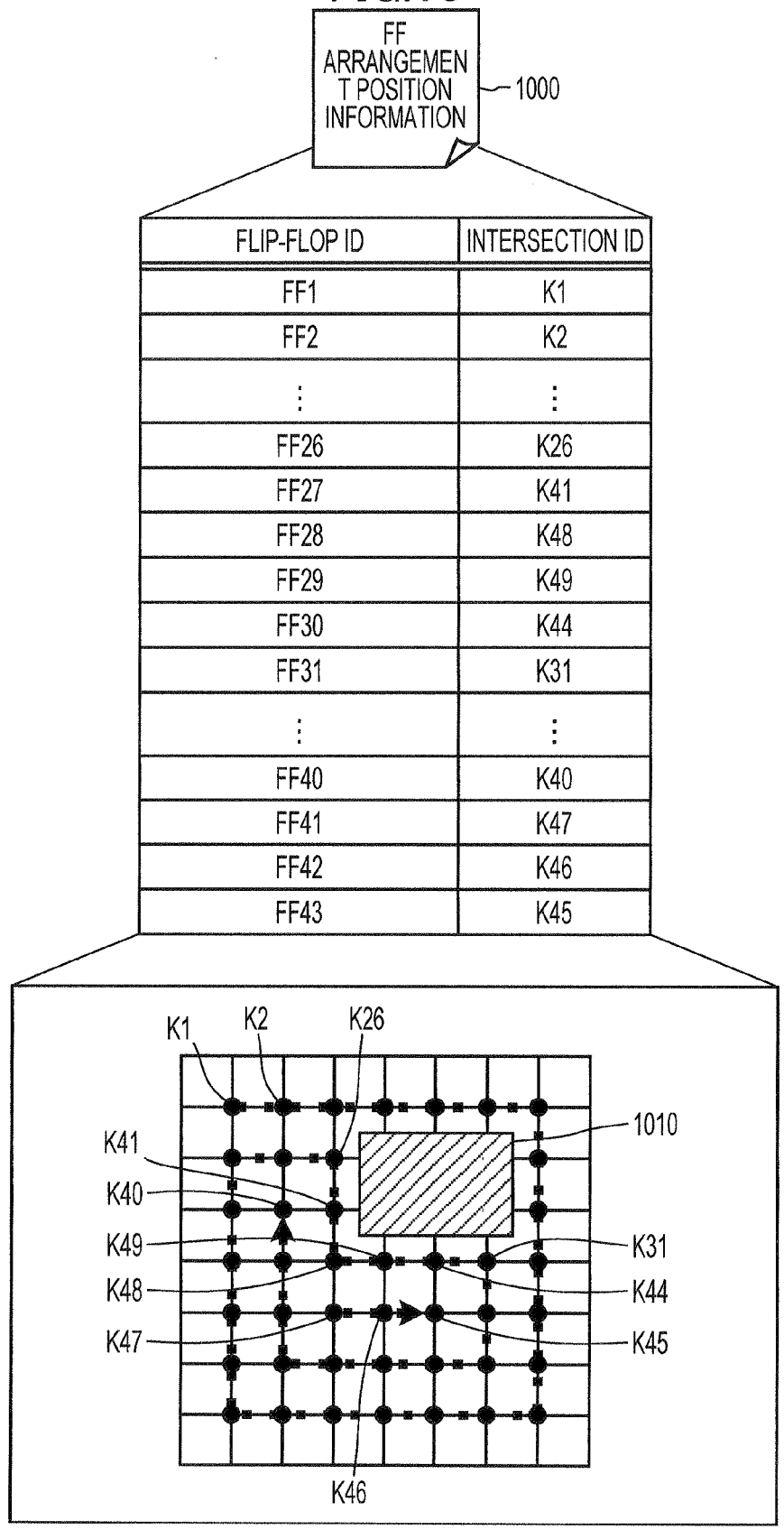
FIG. 10 illustrates exemplary FF arrangement position information.

FIG. 10 illustrates exemplary FF arrangement position information. In FF arrangement position information 1000, among intersections K1 to K49 in the layout area of the target circuit, intersections K27 to K30, K42, and K43 that overlap an arrangement prohibition area 1010 are excluded from the target of the arrangement positions of FFs.

Figure 11:
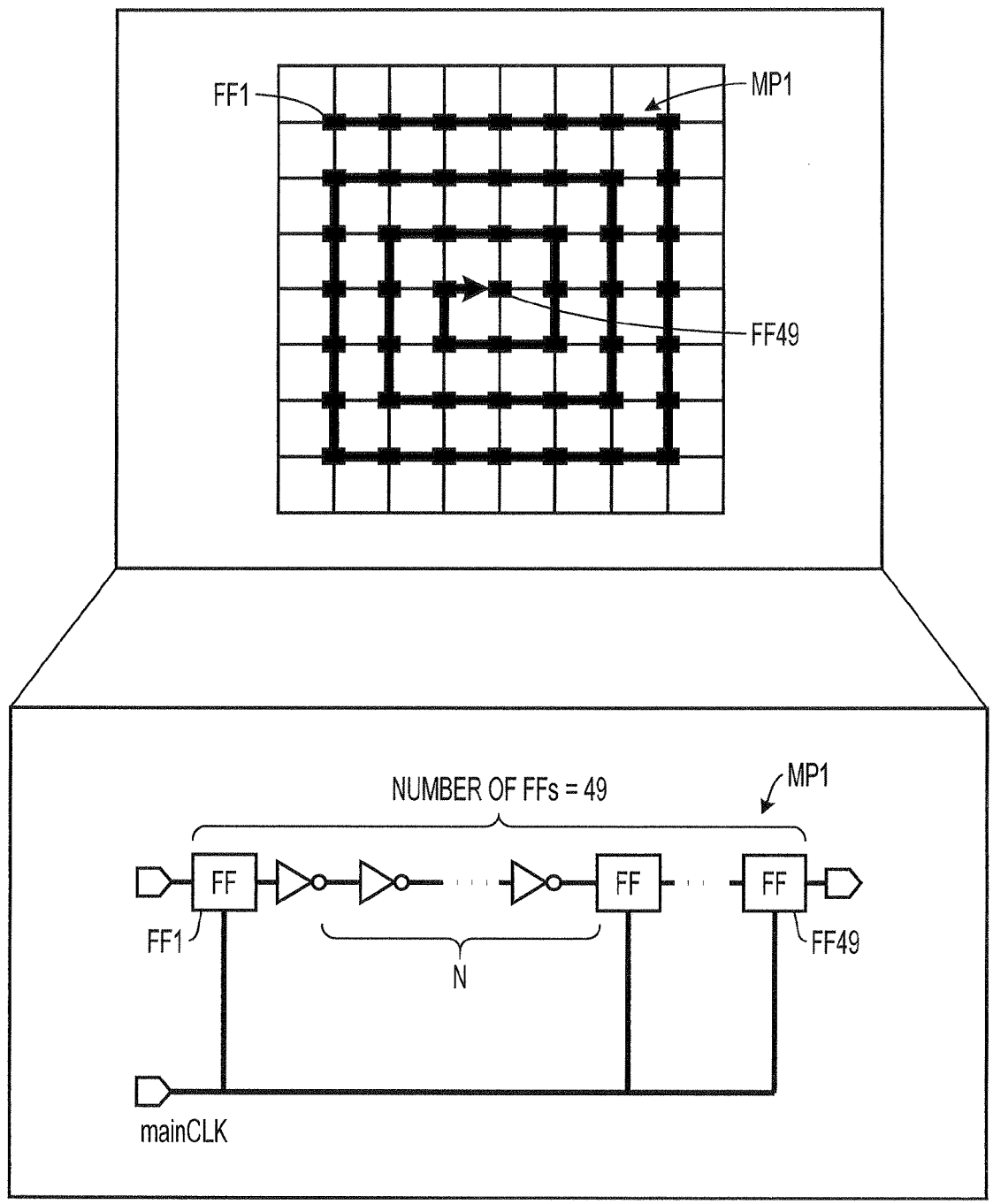
FIG. 11 illustrates an exemplary monitor path.

FIG. 11 illustrates an exemplary monitor path. FIG. 11 illustrates a monitor path MP1 starting from an FF1 serving as a start point and ending with an FF49 serving as an end point.

Figure 12:
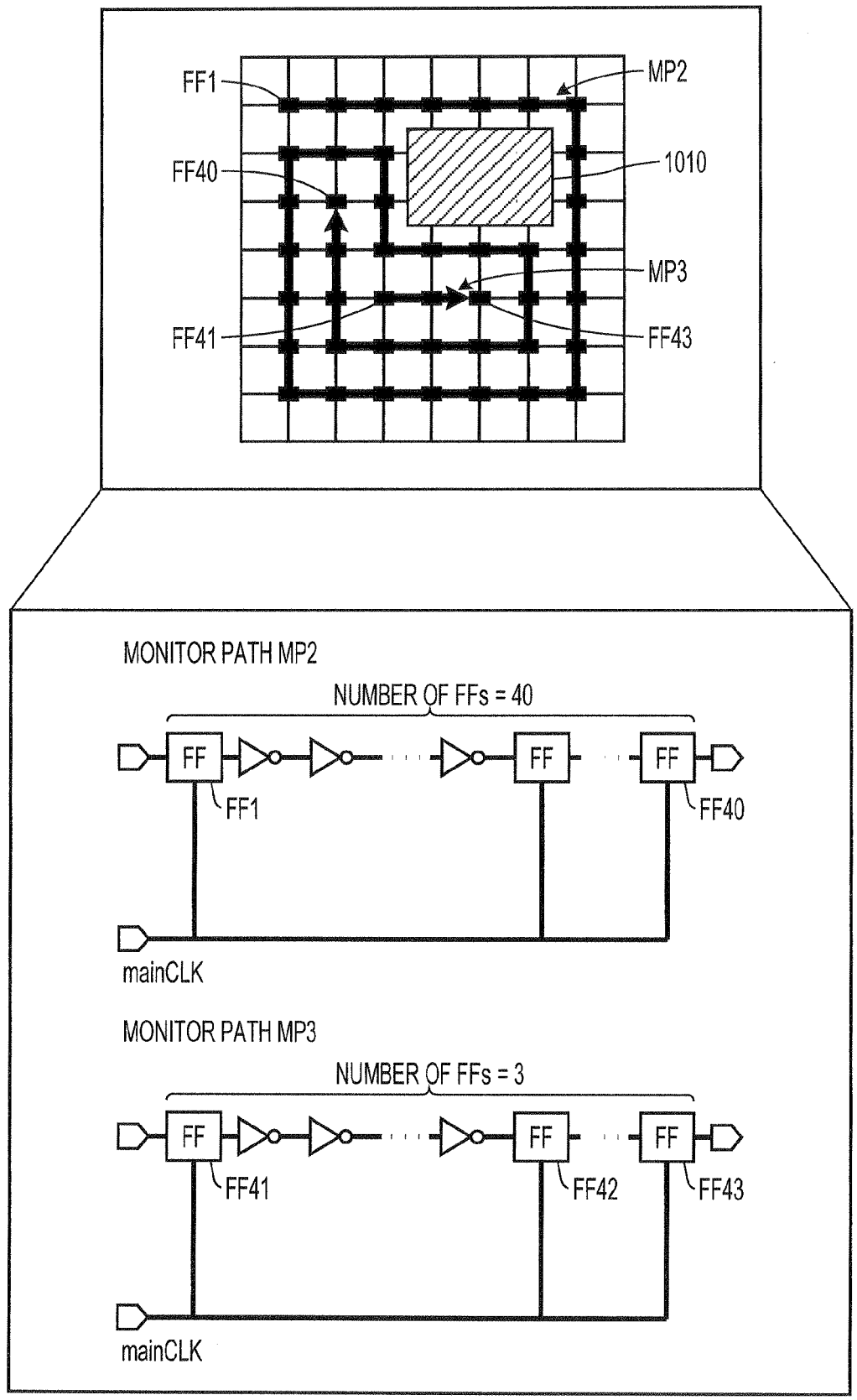
FIG. 12 illustrates exemplary monitor paths.

FIG. 12 illustrates exemplary monitor paths. FIG. 12 illustrates a monitor path MP2 starting from an FF1 serving as a start point and ending with an FF40 serving as an end point, and a monitor path MP3 starting from an FF41 serving as a start point and ending with an FF43 serving as an end point.

A monitor path may be generated by searching a route that passes all the intersections indicated by the FF arrangement position information by using an existing search algorithm. When one monitor path does not pass all the intersections, a plurality of monitor paths may be generated.

Figure 7A:
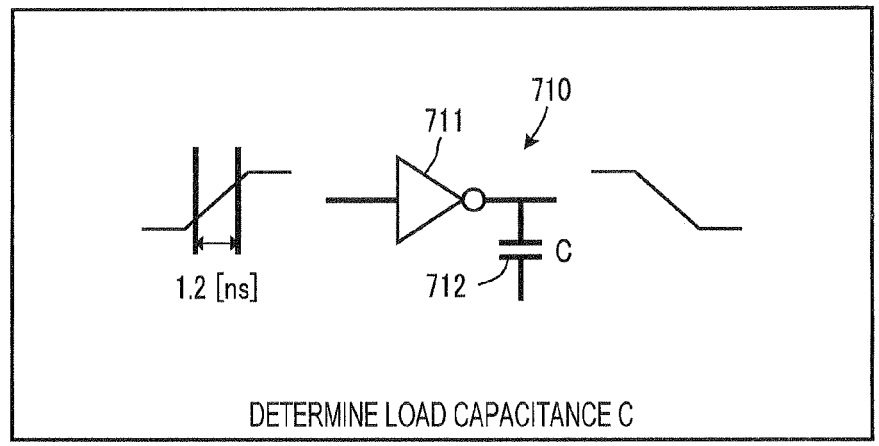
FIGS. 7A to 7F illustrate an exemplary generation of a monitor path.
Figure 7B:
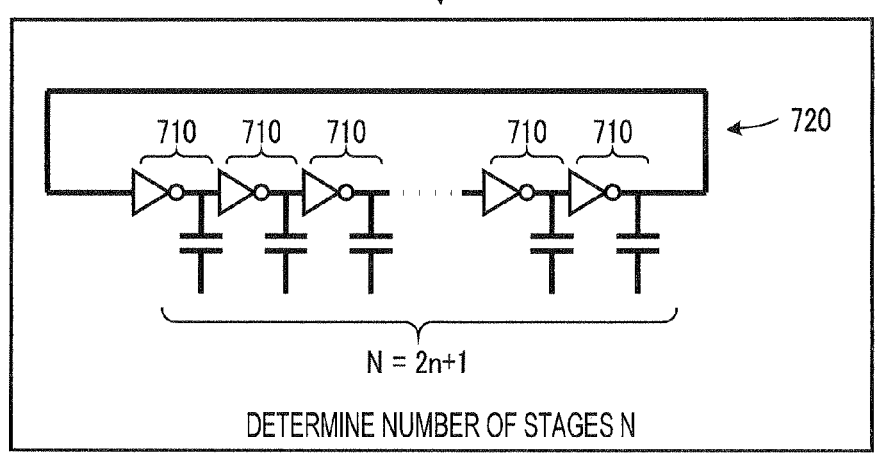
Figure 7C:
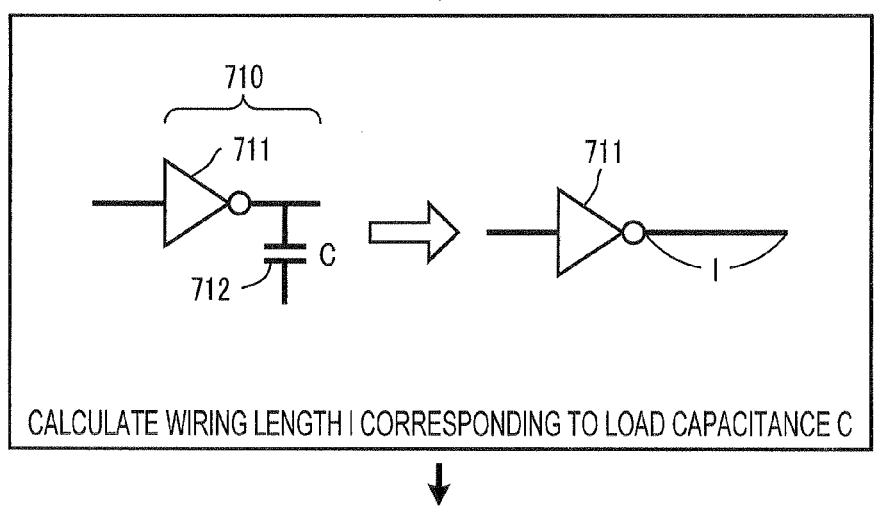
Figure 7D:
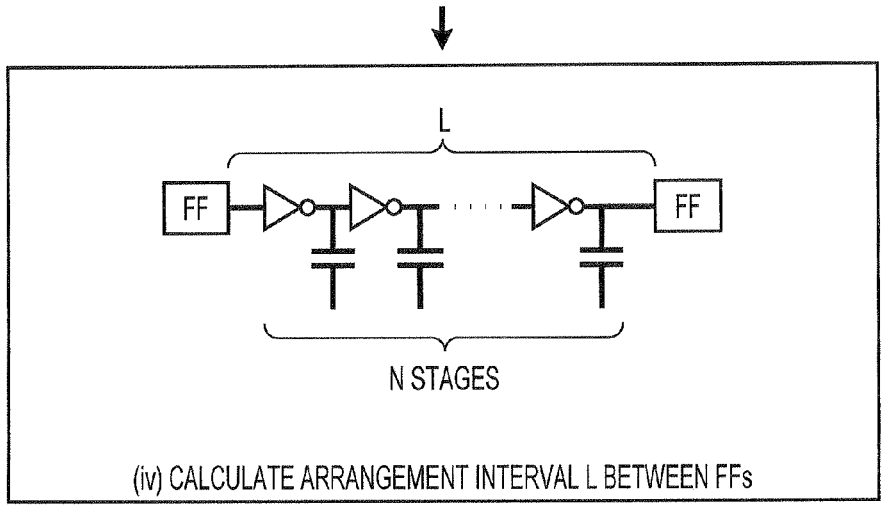
Figure 7E:
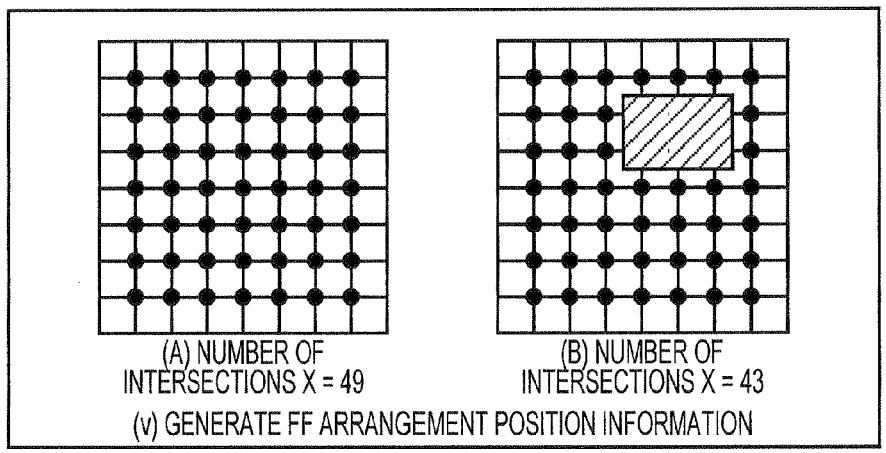
Figure 7F:
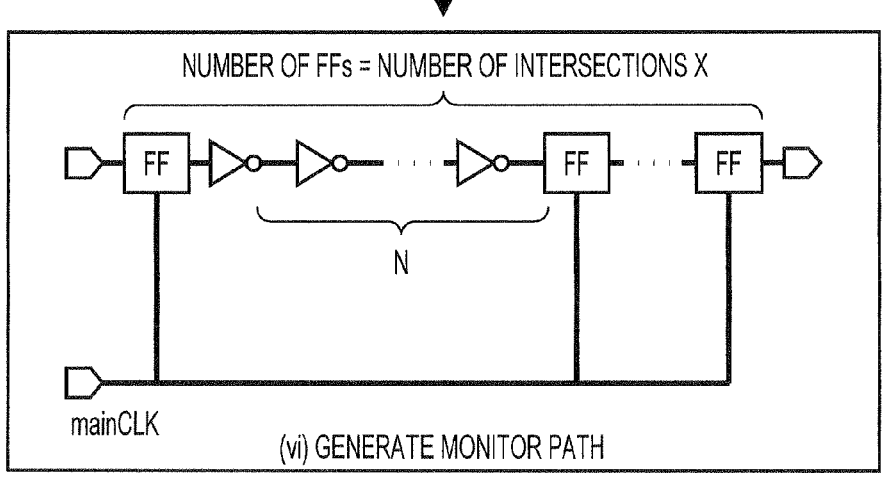

In FFs in a monitor path, a timing error that occurs in the target circuit is tested. The number of test points is adjusted by changing the arrangement interval between FFs in the monitor path. For example, when the load capacitance C is determined as illustrated in FIG. 7A and an inverter 711 having a drive ability higher than a standard drive ability, the number of test points may be decreased. When an inverter 711 having a drive ability lower than the standard drive ability is used, the number of test points may be increased.

FIG. 13 illustrates an exemplary timing analysis. The timing analysis illustrated in FIG. 13 may be timing analysis of a user circuit. A timing analysis result R1 includes field of instance name, arrangement position, setup slack, and abnormal flag. Information is set in each of the fields, so that timing analysis results 1300-1 to 1300-*m* of respective FFs in the user circuit are stored as records.

The instance name indicates an FF in the target circuit. The arrangement position indicates the position where an FF is arranged in the layout area of the target circuit. The arrangement positions are specified by squares with the intersections K1 to K49 being the center, for example, the squares defined by broken lines illustrated in FIG. 13 (hereinafter referred to as "square areas"). The arrangement positions of the square areas are specified by combinations of numerals arranged along X and Y axes illustrated in FIG. 13. The length of one side of each square may be the arrangement interval L between FFs.

The setup slack is a difference between the time when data is to be changed before a clock edge so that an FF reliably captures data and the time when data changes. The time difference may be an absolute value. When the time difference is a certain threshold or larger, a timing error may occur. The certain threshold may be set for each FF. The certain threshold may be 80 ps, for example.

The abnormal flag indicates whether a timing error occurs or not. When no timing error occurs in an FF, "met" is set. When a timing error occurs in an FF, "vio" is set. For example, in the FF having an instance name "ff5", the arrangement position may be (5, 4). The setup slack "−113 ps" is higher than the certain threshold, and thus "vio" is set in the abnormal flag.

FIG. 14 illustrates an exemplary timing analysis. The timing analysis illustrated in FIG. 14 may be timing analysis of a monitor path. A timing analysis result R2 includes field for flip-flop ID, arrangement position, setup slack, and abnormal flag. Information is set in each of the fields, so that timing analysis results 1400-1 to 1400-49 of the respective FFs in the monitor path are stored as records.

In the FF having a flip-flop ID "FF27", the arrangement position may be (5, 3). The setup slack "−325 ps" is higher than the certain threshold, and thus "vio" is set in the abnormal flag.

The detecting unit 406 detects an FF having a timing error based on the timing analysis result R1 of the user circuit. For example, the detecting unit 406 detects ff4 in which the abnormal flag indicates "vio". The detecting unit 406 detects another FF in the monitor path MP1 near ff4. The detecting unit 406 may detect FF27 that is positioned in the same square area as ff4 in the monitor path MP1 based on the arrangement position (5, 3) of ff4. The square area indicates a rectangular range obtained by dividing the circuit element arrangement area into certain quadrangles.

The associating unit 407 associates the timing analysis result of ff4 in the user circuit with the timing analysis result of FF27 in the monitor path MP1 with reference to the timing analysis results R1 and R2. An association result may be stored in the association result table 1500 illustrated in FIG. 15.

FIG. 15 illustrates an exemplary association result table. The association result table 1500 includes field of instance name, flip-flop ID, arrangement position, setup slack, and abnormal flag.

The field item "abnormal flag" includes sub field of user circuit and monitor path. Information is set in each of the field items, so that association results 1500-1 to 1500-3 are stored as records.

The flip-flop ID indicates another FF in the monitor path MP1 near one FF. The setup slack is a setup slack of the one FF.

Figure 16:
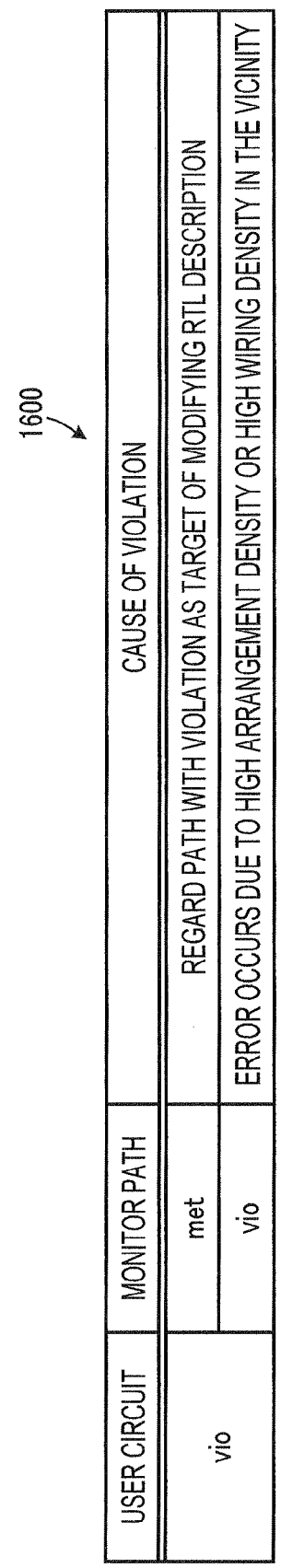
FIG. 16 illustrates an exemplary timing analysis.

FIG. 16 illustrates an exemplary timing analysis. The timing analysis illustrated in FIG. 16 includes comparative analysis. In the comparative analysis, semiconductor integrated circuit information is modified based on the result of a comparison between a first timing analysis result and a second timing analysis result, for example, between the timing analysis result R1 of the user circuit and the timing analysis result R2 of the monitor path. A semiconductor integrated circuit is produced based on the modified semiconductor integrated circuit information. The semiconductor integrated circuit information includes layout data LD after a degree of density has been improved and layout data LD after the RTL description has been modified.

A comparative analysis table 1600 illustrated in FIG. 16 indicates the measurements that are to be taken when a timing error occurs in each combination of a timing analysis result (vio) of one FF in the user circuit and a timing analysis result (vio or met) of the other FF in the monitor path. The other FF in the monitor path may be an FF near the one FF in the user circuit.

For example, when a timing error occurs in the one FF in the user circuit and when no timing error occurs in the other FF in the monitor path (vio/met), it is determined that the timing error occurs due to the circuit configuration of the user circuit, not due to the arrangement density or wiring density near the one FF. Therefore, the RTL description of the path including the one FF in which a timing error occurs may be modified.

When a timing error occurs in the one FF in the user circuit and when a timing error occurs in the other FF in the monitor path (vio/vio), it is determined that the timing errors occur because the arrangement density or wiring density in the vicinity of the one FF is high.

When a timing error occurs in ff4 in the user circuit and a timing error occurs in FF27 in the monitor path MP1, a designer may determine that the arrangement density or wiring density in the vicinity of ff4 is high.

When a timing error occurs in ff5 in the user circuit, the designer may modify the circuit configuration of the user circuit.

When a timing error occurs in ff6 in the user circuit and a timing error occurs in FF29 in the monitor path MP1, the designer may determine that the arrangement density or wiring density in the vicinity of ff6 is high.

The determining unit 408 refers to the association result table 1500. When an association result indicates timing errors of the one FF and the other FF, the determining unit 408 determines the arrangement positions of the FFs to be a dense area.

FIG. 17 illustrates an exemplary dense area list. The dense area list 1700 includes fields of instance name, arrangement position, and setup slack. Information is set in each of the fields, so that information about dense areas is stored as records.

The designer may specify a dense area where the arrangement/wiring density in the layout area of the target circuit is high. The designer may generate layout data LD in which the arrangement/wiring density in the dense area is improved by using an arrangement/wiring tool. The arrangement/wiring tool may correspond to the arranging unit 403 and the second generating unit 404.

When an association result in the association result table 1500 indicates a timing error of an FF, the determining unit 408 determines to change the circuit of the path including the FF.

Figure 18:
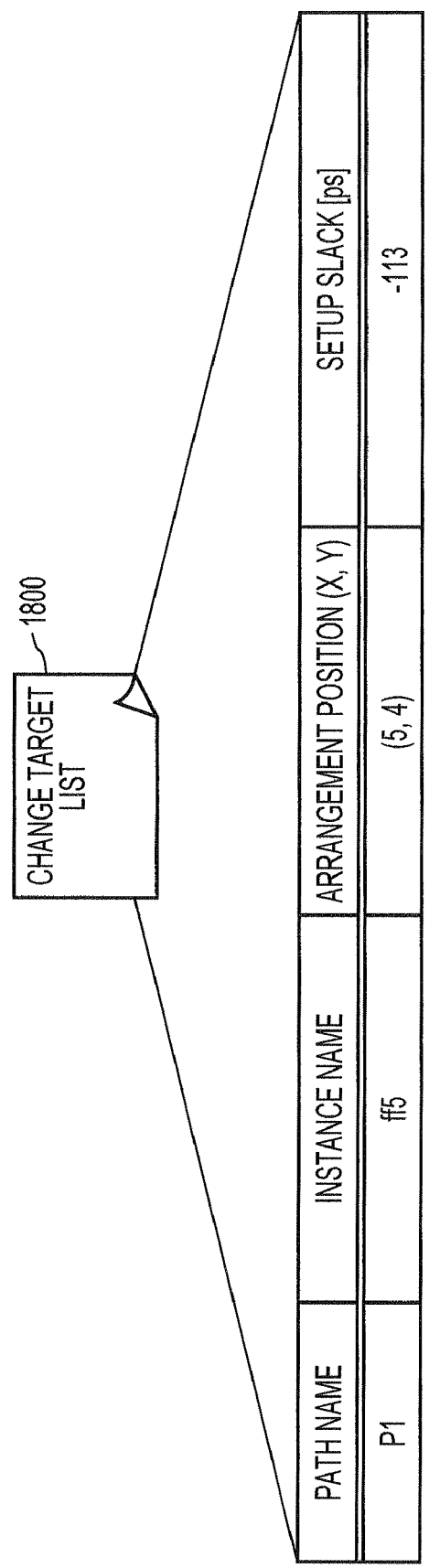
FIG. 18 illustrates an exemplary change target list.

FIG. 18 illustrates an exemplary change target list. The change target list 1800 includes fields of path name, instance name, arrangement position, and setup slack. Information is set in each of the fields, so that information about a target of change of the circuit configuration is stored as a record.

The path name is the name of a path including one FF in which a timing error occurs. The designer may specify a path in which the circuit is to be changed among paths in the target circuit. The designer may modify the RTL description of the path in which the circuit is to be changed based on the change target list 1800.

Figure 19:
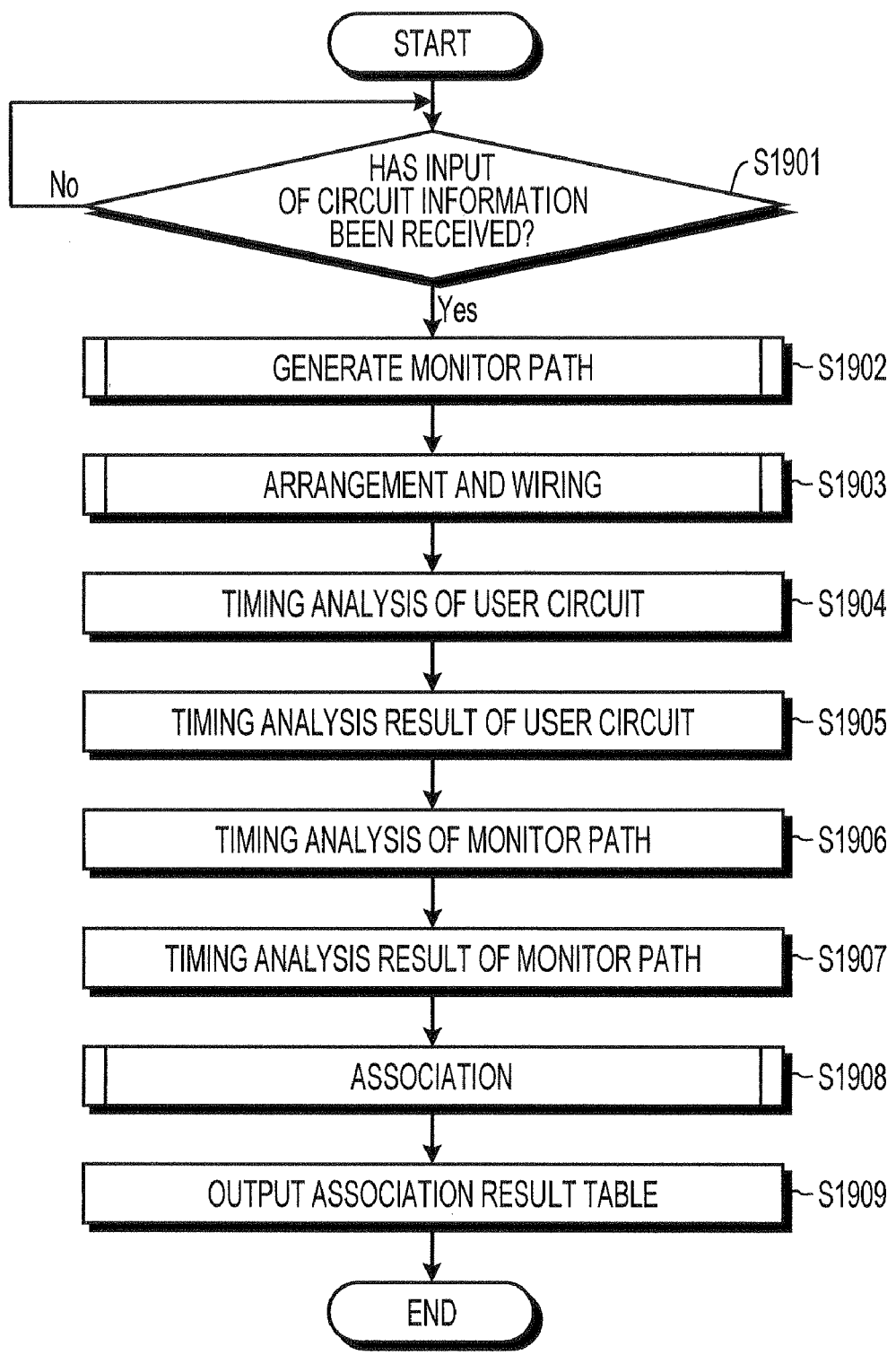
FIG. 19 illustrates an exemplary design support process.

FIG. 19 illustrates an exemplary design support process. In operation S1901, it is determined whether input of circuit information is received by the input unit 401.

If input of circuit information is received (YES in operation S1901), the first generating unit 402 generates a monitor path based on the circuit information in operation S1902. In operation S1903, a user circuit and a monitor path are generated in a layout area of a target circuit.

In operation S1904, the obtaining unit 405 performs timing analysis on the user circuit based on generated layout data LD. In operation S1905, the obtaining unit 405 obtains a timing analysis result R1 of the user circuit. In operation S1906, the obtaining unit 405 performs a timing analysis on the monitor path based on the generated layout data LD. In operation S1907, the obtaining unit 405 obtains a timing analysis result R2 of the monitor path.

In the timing analysis of the user circuit and the monitor path, RC extraction and calculation of a delay time are performed based on the net lists NL1 and NL2 and the layout data LD.

In operation S1908, the associating unit 407 associates a timing analysis result of one FF in the user circuit with a timing analysis result of the other FF in the monitor path. In operation S1909, the output unit 409 outputs the association result table 1500, and the process ends.

Timing analysis is performed on the user circuit and the monitor path that are arranged and wired in the layout area of the target circuit. The timing analysis result may be output while being associated with each FF in the user circuit.

Figure 20:
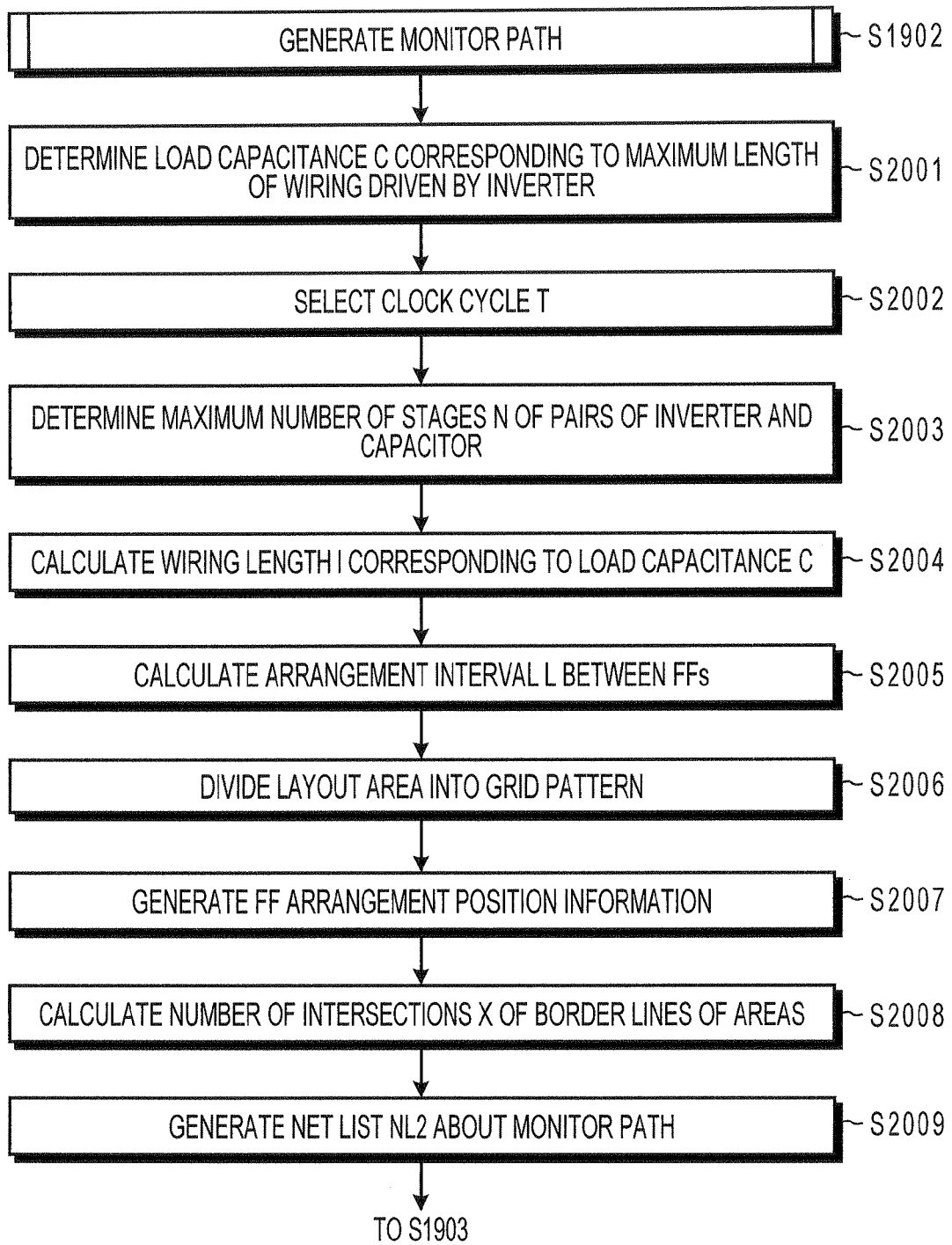
FIG. 20 illustrates an exemplary monitor path generation process.

FIG. 20 illustrates an exemplary monitor path generation process.

In operation S2001, the capacitance determining unit 601 determines the load capacitance C corresponding to the maximum length of wiring that is capable of being driven by the inverter 711 having a standard drive ability. In operation S2002, the number-of-stages determining unit 602 selects a clock cycle T of a main clock from the clock cycle information 500.

In operation S2003, the number-of-stages determining unit 602 determines the maximum number of stages N of the pairs 710 of a ring oscillator, in which a plurality of pairs 710, each having an inverter 711 and a capacitor 712 of the load capacitance C, are cascaded. In operation S2004, the calculating unit 603 calculates the wiring length l corresponding to the load capacitance C.

In operation S2005, the calculating unit 603 calculates an arrangement interval L with which a signal is transmitted between FFs in the clock cycle T. In operation S2006, the first generating unit 402 divides the layout area of the target circuit into a grid pattern, with the arrangement interval L being a grid width. In operation S2007, the first generating unit 402 generates arrangement position information by regarding intersections of border lines of the areas obtained through the division as arrangement positions of FFs.

In operation S2008, the calculating unit 603 calculates the number of intersections X of the border lines of the areas obtained by the division. In operation S2009, the first generating unit 402 generates a net list NL2 that includes FFs, the number of which is the same as the calculated number of intersections X, and a monitor path including N stages of inverters 711 between the respective FFs. Then, the process proceeds to operation S1903 in FIG. 19.

The monitor path is formed in which FFs are arranged at arrangement intervals that cause a timing error based on high density of arrangement/wiring. The FFs are arranged at the intersections of the border lines of the areas obtained by the division, so that the FFs in the monitor path are efficiently arranged over the layout area.

Figure 21:
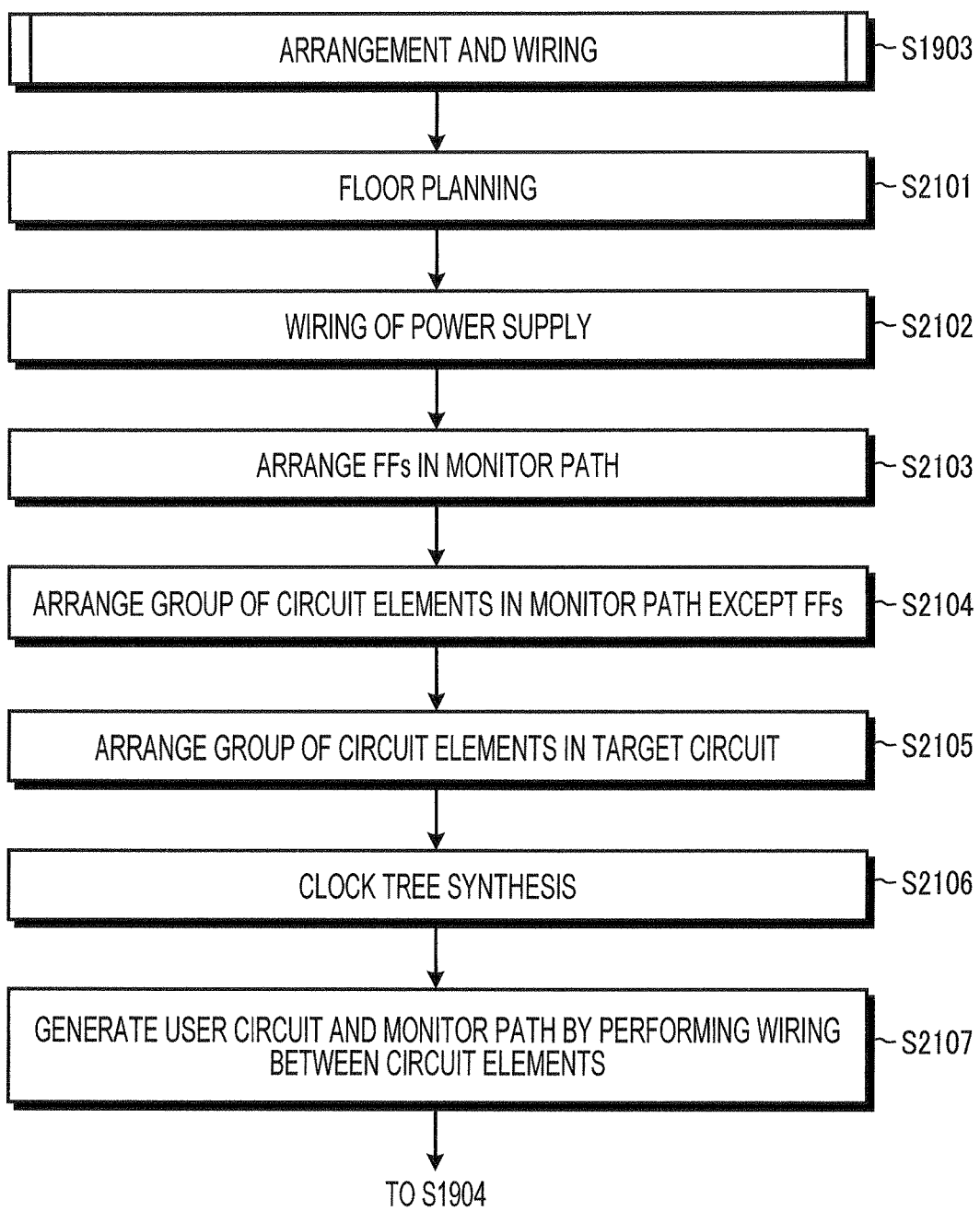
FIG. 21 illustrates an exemplary arrangement/wiring process.

FIG. 21 illustrates an exemplary arrangement/wiring process. In operation S2101, the arranging unit 403 performs floor planning of the target circuit based on the net lists NL1 and NL2. In operation S2102, the arranging unit 403 performs wiring of a power supply.

In operation S2103, the arranging unit 403 arranges the FFs in the monitor path at the arrangement intervals L in the layout area of the target circuit in accordance with the FF arrangement position information generated in operation S2007. In operation S2104, the arranging unit 403 arranges a group of circuit elements in the monitor path except the already-arranged FFs in the layout area of the target circuit.

In operation S2105, the arranging unit 403 arranges a group of circuit elements included in the target circuit in the layout area of the target circuit. After the group of circuit elements has been arranged, adjustment of arrangement positions of the circuit elements, insertion of a buffer, or adjustment of a gate size is performed, so that timing is optimized.

In operation S2106, the second generating unit 404 performs clock tree synthesis based on the layout data LD of the target circuit. After the clock tree synthesis has been completed, adjustment of the gate size of the circuit elements is performed, so that timing is optimized.

In operation S2107, the second generating unit 404 performs wiring between the circuit elements based on the arrangement result, so as to generate a user circuit and a monitor path. Then, the process proceeds to operation S1904 in FIG. 19. After the wiring between the circuit elements has been performed, adjustment of the gate size of the circuit elements is performed, so that timing is optimized.

The user circuit and monitor path are generated in the layout area of the target circuit.

Figure 22:
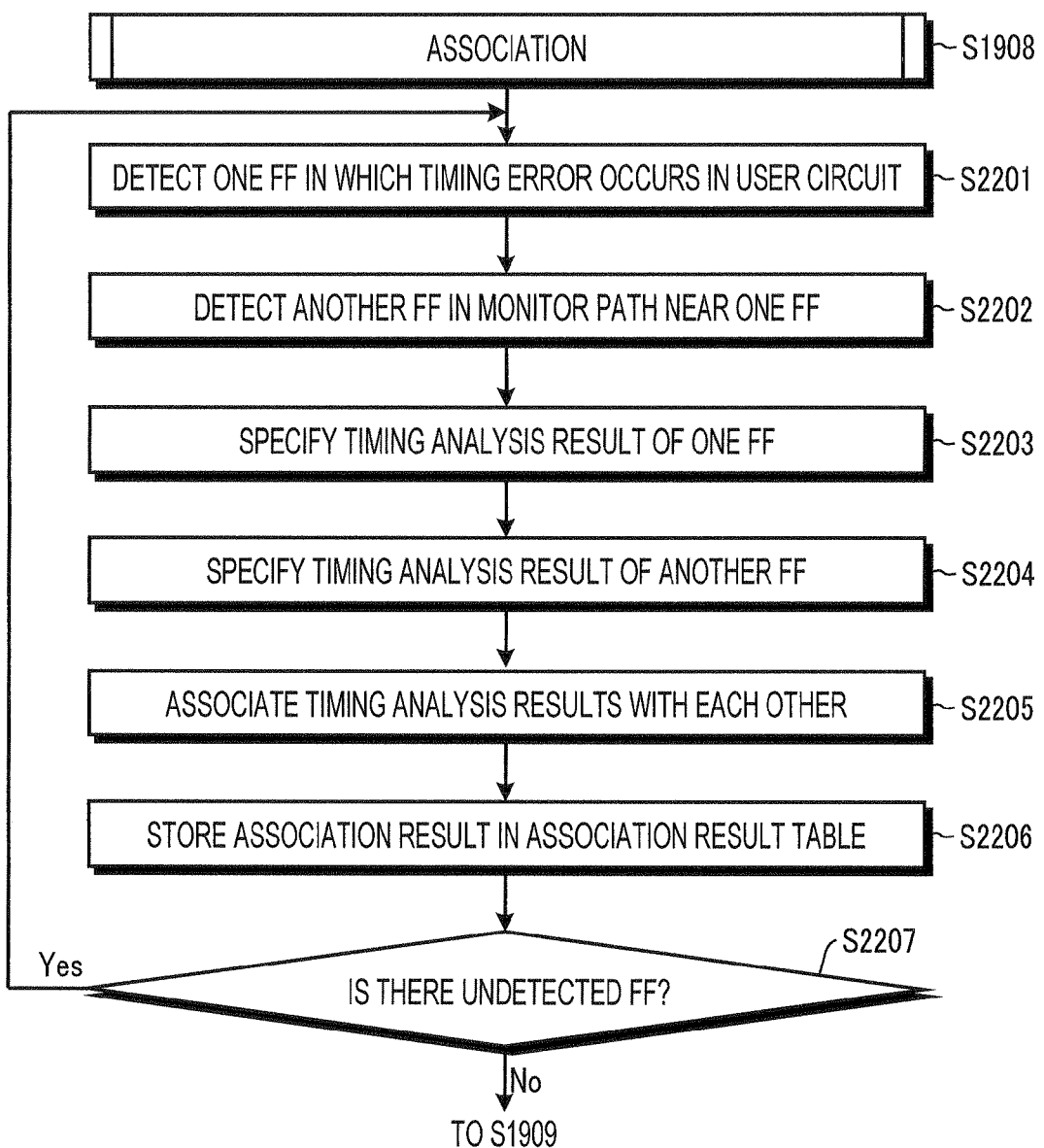
FIG. 22 illustrates an exemplary association process.

FIG. 22 illustrates an exemplary association process. In operation S2201, the detecting unit 406 detects an FF in which a timing error occurs in the user circuit with reference to the timing analysis result R1 and the layout data LD.

In operation S2202, the detecting unit 406 detects another FF in the monitor path near the detected FF with reference to the layout data LD. In operation S2203, the associating unit 407 specifies a timing analysis result of one FF based on the timing analysis result R1.

In operation S2204, the associating unit 407 specifies a timing analysis result of the other FF based on the timing analysis result R2. In operation S2205, the associating unit 407 associates the timing analysis result of the FF with the timing analysis result of the other FF. In operation S2206, the associating unit 407 stores an association result in the association result table 1500.

In operation S2207, the detecting unit 406 determines whether there exists an undetected FF among FFs in which a timing error occurs in the user circuit. If an undetected FF exists (YES in operation S2207), the process returns to operation S2201. If no undetected FF exists (NO in operation S2207), the process proceeds to operation S1909 in FIG. 19.

The timing analysis result of one FF in which a timing error occurs in the user circuit is associated with the timing analysis result of the other FF in the monitor path near the one FF.

Figure 23:
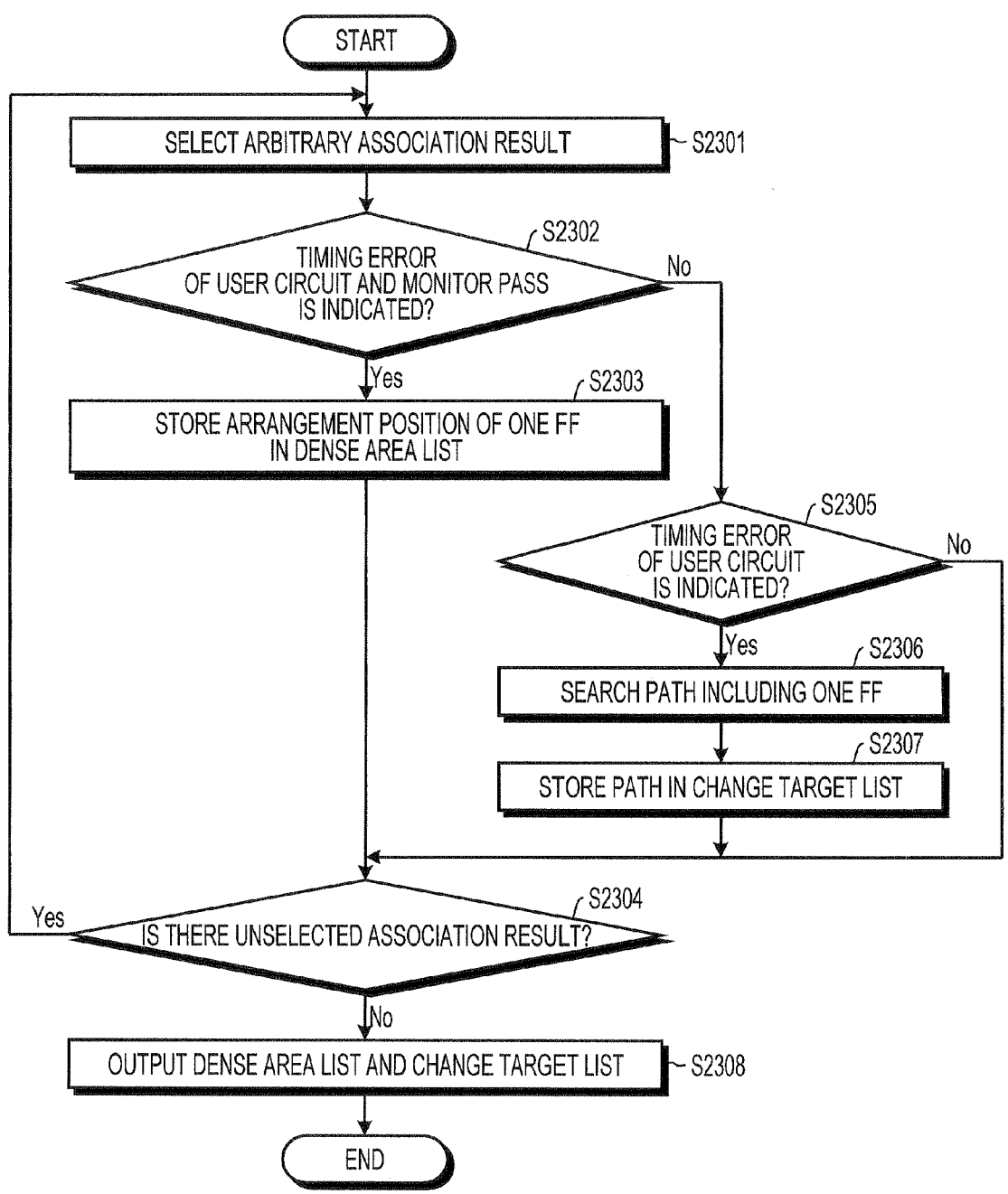
FIG. 23 illustrates an exemplary determination process.

FIG. 23 illustrates an exemplary determination process.

In operation S2301, the determining unit 408 selects an arbitrary association result from the association result table 1500. In operation S2302, the determining unit 408 determines whether the selected association result indicates a timing error of the user circuit and the monitor path.

If a timing error of the user circuit and the monitor path is indicated (YES in operation S2302), the determining unit 408 stores the arrangement position of one FF in the dense area list 1700 in operation S2303. In operation S2304, the determining unit 408 determines whether there exists an unselected association result in the association result table 1500.

If an unselected association result exists (YES in operation S2304), the process returns to operation S2301. If no timing error is indicted in operation S2302, the determining unit 408 determines whether the association result indicates a timing error of the user circuit in operation S2305.

If a timing error of the user circuit is indicated (YES in operation S2305), the determining unit 408 searches a path including one FF in the user circuit in operation S2306. In operation S2307, the searched path is stored in the change target list 1800, and the process proceeds to operation S2304.

If no timing error is indicted (NO in operation S2305), the process proceeds to operation S2304. If there exists no unselected association result (NO in operation S2304), the output unit 409 outputs the dense area list 1700 and the change target list 1800 in operation S2308, and the process ends.

An area where the arrangement/wiring density is to be improved in the layout area of the target circuit is selected. A path in which the RTL description is to be changed in the group of paths in the target circuit is selected.

In operation S2002 illustrated in FIG. 20, the clock cycle T of the main clock is selected from the clock cycle information 500. For example, the design support process illustrated in FIG. 19 may be repeated until clock cycles of all the clocks in the clock cycle information 500 are selected. The association results of the respective clocks ck1 to ck3 in the target circuit may be output.

When a timing error occurs, it may be determined whether the timing error is overcome by buffering or resizing, or whether the RTL description is to be changed. Therefore, trials of a plurality of layouts with various combinations of arrangement and optimization may not be performed in order to check timing analysis results and wiring properties in the respective layouts. Accordingly, a semiconductor integrated circuit may be efficiently designed, and the designing period may be shortened.

The design support program may be recorded in a computer-readable recording medium, such as a hard disk, flexible disk, compact-disk read-only memory (CD-ROM), magnetic disk, or digital versatile disc (DVD). The program may be distributed over a network, such as the Internet.

What is claimed is:

1. A computer-assisted method to be executed by a computer comprising a processor for manufacturing a semiconductor integrated circuit, the method comprising:
   generating, by the processor, first data by performing floor planning of the semiconductor integrated circuit based on semiconductor integrated circuit information and monitor path circuit information;
   generating second data by arranging at least one monitor path flip-flop and at least one monitor path circuit element in the first data based on monitor path position information;
   generating third data by performing arrangement or wiring based on the second data;
   generating a first timing analysis result by performing a timing analysis on data corresponding to the semiconductor integrated circuit information of the third data;
   generating a second timing analysis result by performing a timing analysis on data corresponding to the monitor path circuit information of the third data;
   modifying the semiconductor integrated circuit information by comparing the first timing analysis result with the second timing analysis result; and
   manufacturing the semiconductor integrated circuit based on the modified semiconductor integrated circuit information.

2. The computer-assisted method according to claim 1, wherein the monitor path circuit information includes a plurality of monitor path segments, each of the monitor path segments including cascaded N monitor path circuit elements, each of the N monitor path circuit elements including a given capacitance, where N is an integer of two or more.

3. The computer-assisted method according to claim 2, wherein the monitor path circuit elements are selected such that a signal having a given slew is output, and wherein N corresponds to an odd number of the monitor path circuit elements included in a ring oscillator.

4. The computer-assisted method according to claim 2, wherein monitor path flip-flops are provided between the monitor path segments.

5. The computer-assisted method according to claim 1, further comprising:
   dividing a circuit element arrangement area corresponding to the semiconductor integrated circuit information into quadrangles;
   arranging the monitor path flip-flop at an intersection of the quadrangles; and
   arranging the monitor path circuit element between monitor path flip-flops.

6. The computer-assisted method according to claim 5, wherein, when a first flip-flop included in the semiconductor integrated circuit information is included in an area including at least one of the quadrangles and having a center which is positioned at the arranged monitor path circuit element, the first timing analysis result for the first flip-flop is compared with the second timing analysis result for the at least one arranged monitor path flip-flop.

7. The computer-assisted method according to claim 6, wherein the semiconductor integrated circuit information is modified when the first timing analysis result indicates a timing error and the second timing analysis result does not indicate a timing error.

8. The computer-assisted method according to claim 6, wherein at least one of the first data and the second data is modified when the first timing analysis result indicates a timing error and the second timing analysis result indicates a timing error.

9. The computer-assisted method according to claim 1, wherein the monitor path circuit element includes an inverter and a wire having a given capacitance, the wire being coupled to the inverter.

10. The computer-assisted method according to claim 1, wherein the first timing analysis result for a first flip-flop included in the semiconductor integrated circuit information is compared with the second timing analysis result for a monitor path flip-flop arranged near the first flip-flop.

11. A non-transitory computer-readable recording medium storing a program to be executed by a computer, the program comprising a set of code for causing the computer to:
   generate first data by performing floor planning of a semiconductor integrated circuit based on semiconductor integrated circuit information and monitor path circuit information;
   generate second data by arranging at least one monitor path flip-flop and at least one monitor path circuit element in the first data based on monitor path position information;

generate third data by performing arrangement or wiring based on the second data;

generate a first timing analysis result by performing a timing analysis on data corresponding to the semiconductor integrated circuit information of the third data;

generate a second timing analysis result by performing a timing analysis on data corresponding to the monitor path circuit information of the third data;

modify the semiconductor integrated circuit information by comparing the first timing analysis result with the second timing analysis result; and manufacture the semiconductor integrated circuit based on the modified semiconductor integrated circuit information.

12. The non-transitory computer-readable recording medium according to claim 11, wherein the monitor path circuit information includes monitor path segments, each of the monitor path segments including cascaded N monitor path circuit elements, each of the N monitor path circuit elements including a given capacitance, where N is an integer of two or more.

13. The non-transitory computer-readable recording medium according to claim 12, wherein the monitor path circuit elements are selected so that a signal having a given slew is output, and wherein N corresponds to an odd number of the monitor path circuit elements included in a ring oscillator.

14. The non-transitory computer-readable recoding medium according to claim 12, wherein monitor path flip-flops are provided between the monitor path segments.

15. The non-transitory computer-readable recording medium according to claim 11, further comprising:

dividing a circuit element arrangement area corresponding to the semiconductor integrated circuit information into quadrangles;

arranging the monitor path flip-flop at an intersection of the quadrangles; and arranging the monitor path circuit element between monitor path flip-flops.

16. The non-transitory computer-readable recording medium according to claim 15, wherein, when a first flip-flop included in the semiconductor integrated circuit information is included in an area including at least one of the quadrangles and having a center which is positioned at the arranged monitor path circuit element, the first timing analysis result for the first flip-flop is compared with the second timing analysis result for the at least one arranged monitor path flip-flop.

17. The non-transitory computer-readable recording medium according to claim 11, wherein the monitor path circuit element includes an inverter and a wire having a given capacitance, the wire being coupled to the inverter.

18. The non-transitory computer-readable recording medium according to claim 11, wherein the first timing analysis result for a first flip-flop included in the semiconductor integrated circuit information is compared with the second timing analysis result for a monitor path flip-flop arranged near the first flip-flop.

* * * * *